US012694171B2

(12) United States Patent
Kuipers

(10) Patent No.: US 12,694,171 B2
(45) Date of Patent: Jul. 28, 2026

(54) METHOD OF DETERMINING TOOLPATHS FOR AN INFILL STRUCTURE FOR A DIGITAL 3D MODEL

(71) Applicant: Ultimaker B.V., Utrecht (NL)

(72) Inventor: Tim Kuipers, Utrecht (NL)

(73) Assignee: Ultimaker B.V., Zaltbommel (NL)

( * ) Notice: Subject to any disclaimer, the term of this patent is extended or adjusted under 35 U.S.C. 154(b) by 1057 days.

(21) Appl. No.: 17/787,969

(22) PCT Filed: Dec. 2, 2020

(86) PCT No.: PCT/EP2020/084256
§ 371 (c)(1),
(2) Date: Jun. 22, 2022

(87) PCT Pub. No.: WO2021/139928
PCT Pub. Date: Jul. 15, 2021

(65) Prior Publication Data
US 2023/0236571 A1     Jul. 27, 2023

(30) Foreign Application Priority Data

Jan. 6, 2020     (EP) ..................................... 20150349

(51) Int. Cl.
| | |
|---|---|
| *G06F 30/17* | (2020.01) |
| *B29C 64/393* | (2017.01) |
| *G05B 19/4099* | (2006.01) |
| *G05B 19/4103* | (2006.01) |

(52) U.S. Cl.
CPC ............ *G06F 30/17* (2020.01); *B29C 64/393* (2017.08); *G05B 19/4099* (2013.01); *G05B 19/4103* (2013.01); *G05B 2219/49023* (2013.01)

(58) Field of Classification Search
None
See application file for complete search history.

(56) References Cited

PUBLICATIONS

Ding, D., Pan, Z., Cuiuri, D., Li, H. and Larkin, N., 2016. Adaptive path planning for wire-feed additive manufacturing using medial axis transformation. Journal of Cleaner Production, 133, pp. 942-952.
Jin, Y., Du, J. and He, Y., 2017. Optimization of process planning for reducing material consumption in additive manufacturing. Journal of Manufacturing Systems, 44, pp. 65-78.
Kuipers, T., Doubrovski, E.L., Wu, J. and Wang, C.C., 2020. A framework for adaptive width control of dense contour-parallel toolpaths in fused deposition modeling. Computer-Aided Design, 128, p. 102907.

*Primary Examiner* — Shelley Chen
(74) *Attorney, Agent, or Firm* — Ipsilon USA—NLO

(57) ABSTRACT

The invention relates to a method of determining toolpaths for an infill structure for a digital 3D model. The invention provides for a framework for planning toolpaths with control over the adaptive width for minimizing over- and underfill and introduce a beading scheme which reduces the bead width variation compared to the state of the art. We show that this framework supports various control schemes (so-called 'beading schemes') for determining the bead spacing and extrusion widths. Furthermore we present an approach to accurately realize adaptive bead width. The proposed method provides for a geometric framework allowing various adaptive bead width control schemes used to generate contour-parallel toolpaths which minimize under- and overfill.

7 Claims, 12 Drawing Sheets

Fig. 5A          Fig. 5B          Fig. 5C          Fig. 5D          Fig. 5E
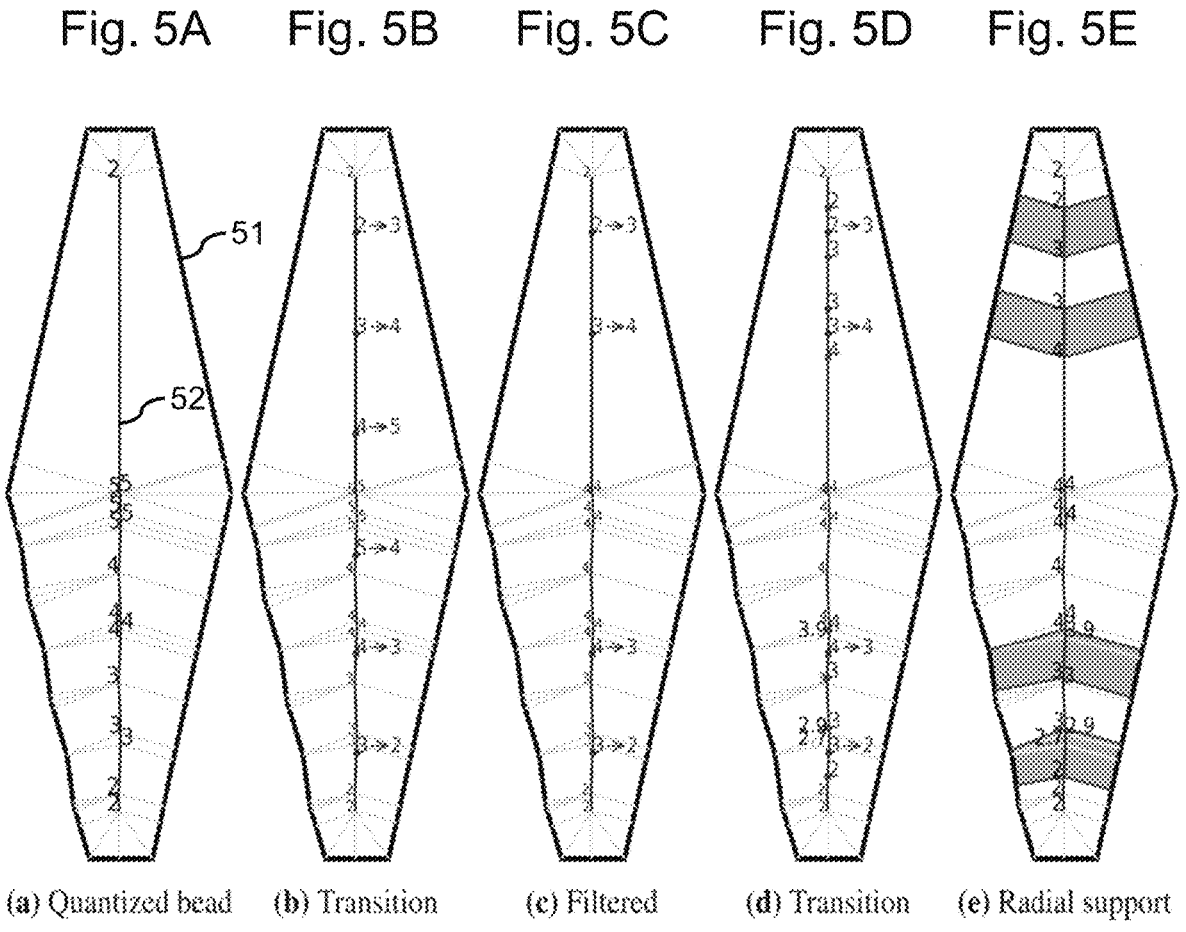
(a) Quantized bead   (b) Transition   (c) Filtered   (d) Transition   (e) Radial support
Fig. 6A
Fig. 6B
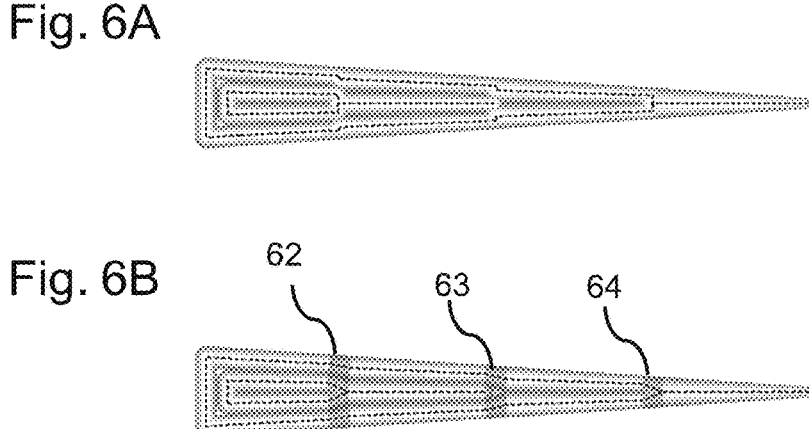

(a) Beading conflict (b) Conflict resolution 130     131

132     133

135     136     134     137

METHOD OF DETERMINING TOOLPATHS FOR AN INFILL STRUCTURE FOR A DIGITAL 3D MODEL

FIELD OF THE INVENTION

The present invention relates to a method of determining toolpaths for an infill structure for a digital 3D model. It also relates to a computing device and to a computer program product. Furthermore, it relates to a method of controlling a system for three dimensional additive layer deposition, and to a further computer program product for performing the method of controlling a system for three dimensional additive layer deposition.

BACKGROUND ART 3D printing enables the fabrication of complex geometry under few design constraints compared to conventional fabrication techniques. Recent developments have seen a rapid growth in both the use and capabilities of desktop 3D printing systems. Fused Deposition Modelling (FDM) is one of the most common 3D printing techniques. It is widely used because of the versatility in the types of plastic which can be used and the relatively low running costs. FDM printers are used, for example, in showcasing scale models of buildings, casings for electronics, prototypes for blow moulded parts, jigs and fixtures. Recent research developments have investigated manufacturing complex volumetric structures such as microstructures [1, 2, 3] and topology optimized structures [4, 5, 6]. Many of these applications involve 3D models with detailed features within the order of magnitude of the printing resolution, which restrains the field of the process planning algorithms.

FDM printers extrude semi-continuous beads of molten plastic through a nozzle, which moves along a planned toolpath within each layer of a 3D object. A common strategy to accurately manufacture a given 3D model is to extrude along a contour following path, because the position and shape of the toolpath can be controlled relatively accurately. Filling up a shape using parallel straight lines would expose defects of the size of the hole in the nozzle, which is generally an order of magnitude larger than the resolution of the positioning system. Because contour-parallel extrusion leads to a more accurate outline shape it is common practice to print either the whole layer or only a limited number of outer perimeters that way.

The simple technique for generating the dense contour-parallel toolpaths of a layer consists in performing uniform inward offsets with the size of the nozzle from the outline shape. However, for geometrical features which are not an exact multiple of the nozzle size this method produces areas where an extrusion bead is placed twice: overfill areas; and areas which are not filled at all: underfill areas. Overfills cause a build-up of pressure in the mechanical extrusion system, which can result in bulges or even a full print failure. Underfills on the other hand, can cause a drastic decrease in the part stiffness or even for small features not to be printed at all. These problems are exacerbated for models with layer outlines with small features, because the over- and underfill areas are relatively large compared to the whole part.

One promising direction to avoid over- and underfills is to employ toolpath with adaptive width. Ding et al. developed a toolpath strategy for wire and arc additive manufacturing which produces a width variation typically lower than a factor of 3, but is far greater for some parts [7, 8]. However, the range of widths manufacturable by FDM systems is limited. A nozzle of 0.4 mm will typically start to cause fluttered extrusion around lines narrower than 0.3 mm and lines will start to bulge upward if they are wider than the flat part of the nozzle, which is typically 1.0 mm.

The current state of the art for FDM printing developed by Jin et al. employs a strategy which alters the widths of the centremost beads within a range of widths with a factor of 3.6 [9], which is similar to the strategy employed by the open source industry standard software package Ultimaker Cura @[10]. Still, controlling the extrusion width through movement speed changes or through volumetric flow control (e.g. linear advance) yields diminishing accuracy for deposition widths farther away from the nozzle size, since process parameters such as nozzle temperature are optimized for beads with the nozzle size. Moreover, reducing the variation in width is beneficial for limiting the variation in mechanical properties of the resulting product, meaning it conforms better to a simulation which employs a homogeneity assumption. Therefore, a narrower range of widths is desirable.

Toolpath generation consists in generating a path in a planar contour, representing the intersection of a plane and a 3D solid object. The nozzle is then instructed to move along the path while extruding material. Sites along the toolpath are assigned several properties such as movement speed, but for this patent application we will focus on the assigned width of the extruded bead. Toolpath generation is an integral part of process planning for 3D printing. For an overview of the processing pipeline, we refer to the survey by Livesu et al. [11]. For reducing printing time and material cost, sparse infill structures such as triangular and hexagonal patterns have been used to approximate the interior of 3D shapes. In this patent application, we focus on generating toolpath that seamlessly fills the entire 2D contour. This is sometimes called 'dense infill' [11].

The toolpath has a direct influence on the printing time, material cost, and mechanical properties of the printed object [12, 13]. FDM calls for toolpaths with several desirable properties. First, the extrusion path should be as continuous as possible. A discontinuous path requires to stop and restart material extrusion. For certain materials such as TPU, this could lead to printing defects or even print failure [14]. Second, the toolpath is preferred to be smooth. Sharp turns require to reduce the movement speed of the nozzle, and so this prolongs the printing process. Third, the extruded path should cover the region of the contour without gaps. Such underfill negatively influences the mechanical performance of the parts. Fourth, the extrusion paths should not overlap with one another. Such overfill causes a pressure build up in the mechanical system, which leads to over-extrusion in further paths and in extreme cases cause print failure [14]. An analysis of under- and overfill from a vertical cross-section was presented in [15]. Our method is primarily concerned with minimizing under- and overfill within horizontal cross-sections.

Two basic strategies for dense toolpath generation are direction-parallel and contour-parallel. Direction-parallel (or zigzag) toolpaths fill an arbitrarily shaped contour with a set of parallel, equally spaced line segments. These parallel segments are linked together at one of their extremities, to avoid discontinuous extrusion. Contour-parallel toolpaths typically consists of a set of equally spaced offsets from the slice boundary outline polygons. Steuben et al. presented a method for generating sparse infill toolpaths based on the iso-contours of surface plots of some variable generated on each 2D contour [16]. In order to increase the continuity of contour-parallel toolpaths, a strategy to connect dense toolpaths into spirals was introduced by Zhao et al. [17] and later extended to also connect a mixture of dense and sparse toolpaths together [14]. Jin et al. discusses several approaches for connecting direction-parallel and contour-parallel toolpaths into continuous paths [18]. Spiral toolpaths have also been applied to (CNC) machining [19, 20]. One of the problems with contour-parallel toolpath is that it tends to leave gaps between the toolpaths. This is due to the fact that the diameter of the part is not exact multiple of the (constant) deposition width in those regions. To avoid problems with such gaps, hybrid approaches that combine direction and contour-parallel are often used [21, 22]. Close to the slice boundary, there are several contour-parallel curves, while in the interior is filled using a zig-zag pattern. For complex shapes, the entire cross-section could be decomposed into a set of patches, and for each of them the basic strategies can be applied [23, 18]. Alternative toolpath patterns, seen also in CNC machining, include space-filling curves [24, 25, 26].

Reducing under- and over-filling can be accurately achieved by making use over adaptive deposition width. Adaptive width can be used to locally match the nonuniform space between adjacent paths, and thus to ensure a better filling of the area. Kao and Prinz propose smooth adaptive toolpaths based on the medial axis skeleton of the boundary contour [27]. Their approach handles simple geometry where there are no branches in the medial axis. An extension was proposed by Ding et al. to handle complex shapes [7]. However, this extension inherits a problem in the original method: from any point in the skeleton to the boundary, the number of toolpaths is constant. Since the distance may vary considerably for shapes with both large and small features, this strategy leads to a toolpath with widths that may differ by a factor beyond 3, which is impossible for some FDM systems. Jin et al. proposed a strategy of adding a toolpath with varying width along the center edges of the skeleton, while leaving other paths unchanged [9]. The resulting variation of width in the center is still up to a factor of 3.6.

Under- and over-filling issues have a large proportional impact for thin geometric features. Jin et al. proposed a sparse wavy path pattern for thin-walled parts [28]. Besides under- and over-filling, there are a few other robustness issues in toolpath generation for thin geometric features. Moesen et al. proposed a method to make beam compensation more reliable for thin geometric features [29]. Behandish et al. presented a method to characterize local-topological discrepancies due to material under- and over-deposition and used this information to modify the as manufactured outcomes [30]. A strategy for generating contour-parallel toolpaths using the medial axis transform (MAT) has been described in [31].

SUMMARY OF THE INVENTION

It is an object of the present invention to solve at least some of the problems of the state of the art mentioned above.

According to a first aspect, there is provided a method of determining toolpaths for an infill structure for a digital 3D model, the method comprising:

a. receiving a polygon, the polygon representing an outline of a layer of the digital 3D model;

b. computing a skeleton using a medial axis of the polygon, the skeleton comprising a plurality of nodes and edges connecting the nodes;

c. determining, for each node v, a feature radius value, where the feature radius of a location on the skeleton is defined as the radius of an inscribed circle centered at the location;

d. marking of some of the edges using a significance criterium to obtain marked edges, leaving edges not marked as being unmarked edges, and defining marked nodes as those nodes which are connected to a marked edge and unmarked nodes as being those nodes that are not connected to any marked edge;

e. assigning each marked node in the skeleton an bead count value b, which is defined as a number of beads to fit along a diameter of the inscribed circle centered at the respective marked node;

f. assigning to each marked node, a bead distribution B, defined as the combination of a location list L of feature radii values and a bead width list W of bead widths, for which the location list and bead width list have a size of at least half of the bead count b assigned to that marked node;

g. assigning to each unmarked node, a bead distribution B which is based on the bead distributions of nodes connected to the unmarked node via an edge of the skeleton;

h. determining, on each unmarked edge, junctions at those locations along the unmarked edge where the feature radius corresponds to any of the feature radii values in the location list of the node with the higher feature radius value of the two nodes connected to the respective unmarked node and assigning to each of the junctions a corresponding bead width out of the bead width list W;

i. filling the polygon with toolpaths, the toolpaths passing through the junctions and having a variable width defined by the assigned bead widths.

The invention provides for a framework for planning toolpaths with control over the adaptive width for minimizing over- and underfill and introduce a beading scheme which reduces the bead width variation compared to the state of the art. We show that this framework supports various control schemes (so-called 'beading schemes') for determining the bead spacing and extrusion widths. Furthermore we present an approach to accurately realize adaptive bead width. The proposed method provides for a geometric framework allowing various adaptive bead width control schemes used to generate contour-parallel toolpaths which minimize under- and overfill. We also present a specific beading scheme which furthermore reduces the amount of variation in the extrusion widths compared to the state of the art to be below a factor of 2.

The computing of the skeleton may comprise:

decomposing areas between the medial axis and the polygon into a set of trapezoids and triangles, by introducing further unmarked edges from the nodes of the medial axis to a closest point on the polygon;

finding curved lines in the medial axis and dividing the curved lines into a number of straight edges.

In this way the skeleton does only comprise straight edges, and as a result, the complete area inside the polygon can be divided into triangles and trapezoids. This will enable the use of several advantageous processing schemes.

The marking of some of the edges may comprise:

calculating, for each edge of the skeleton, a significance value S, with $S=|r1-r2|/D$, wherein r1 is the feature radius of a first node of the edge, and r2 is a feature radius of a second node of the edge, and D is a length of the edge;

marking those edges of the skeleton that have a significance value S which is lower than a predefined threshold T to obtain the marked edges.

The bead count value b of a node may be determined by b=round(2r/w*), with r being the feature radius of the node and w* being the preferred bead width.

The method may also comprise:

determining on each of the marked edges one or more anchor points using the bead count of the associated nodes;

optionally, removing anchor points which lie within a threshold distance from each other;

determining around each anchor point, a transition starting point and a transition end point lying on the associated marked edge;

adding the transition starting point and transition end point of all the anchor points as further nodes into the skeleton;

adding, for each one of the further nodes of the skeleton an unmarked edge between each of the further nodes of the skeleton and a closest point on the polygon which is closest to the further node.

The one or more anchor points may be determined at locations on the skeleton which have a feature radius for which the quantization operator q transitions from n to n+1, with n an integer value.

According to a further aspect, there is provided a computing device comprising one or more processing units, the one or more processing units being arranged to perform the method as described above.

According to yet a further aspect, there is provided a computer program product comprising code embodied on computer-readable storage and configured so as when run on one or more processing units to perform the method as described above. The code may be compiled code (such as compiled C++ coding) executable on a personal computer or any other type of device having one or more processing units.

According to yet a further aspect, there is provided a method of controlling an additive manufacturing system comprising a build surface extending in an x and y direction, an extruder head configured to deposit an extrudable material on the build surface, the method comprising:

controlling the system so as to print material on the build surface along predetermined toolpaths and with a predetermined variable bead width, wherein the predetermined toolpaths and variable bead width are determined by the method of determining toolpaths for an infill structure for a digital 3D model as described above.

According to a final aspect, there is provided a computer program product comprising code embodied on computer-readable storage and configured so as when run on one or more processing units to perform the method of controlling an additive manufacturing system as described above. This code may comprise instructions for a 3D printing device to manufacture a 3D object by way of additive manufacturing. The code may be communicated to and/or stored onto the 3D printing device as G-code in order to move the extruder head relative to the build surface along the determined toolpaths.

BRIEF DESCRIPTION OF THE DRAWINGS

These and other aspects of the invention are apparent from and will be elucidated with reference to the embodiments described hereinafter. In the drawings, FIG. 1 schematically shows a computing device 10 according to an embodiment;

FIG. 5A-5D show a simple shape (i.e. polygon) to explain the steps of applying bead counts and transitioning on a shape;

FIG. 6A shows a wedge shape print area in which dashed lines indicate the determined toolpaths showing sharp transitions;

FIG. 6B shows the print area of FIG. 6A with more smooth transitions;

It should be noted that items which have the same reference numbers in different Figures, have the same structural features and the same functions, or are the same signals. Where the function and/or structure of such an item has been explained, there is no necessity for repeated explanation thereof in the detailed description.

DETAILED DESCRIPTION OF EMBODIMENTS

Figure 1:
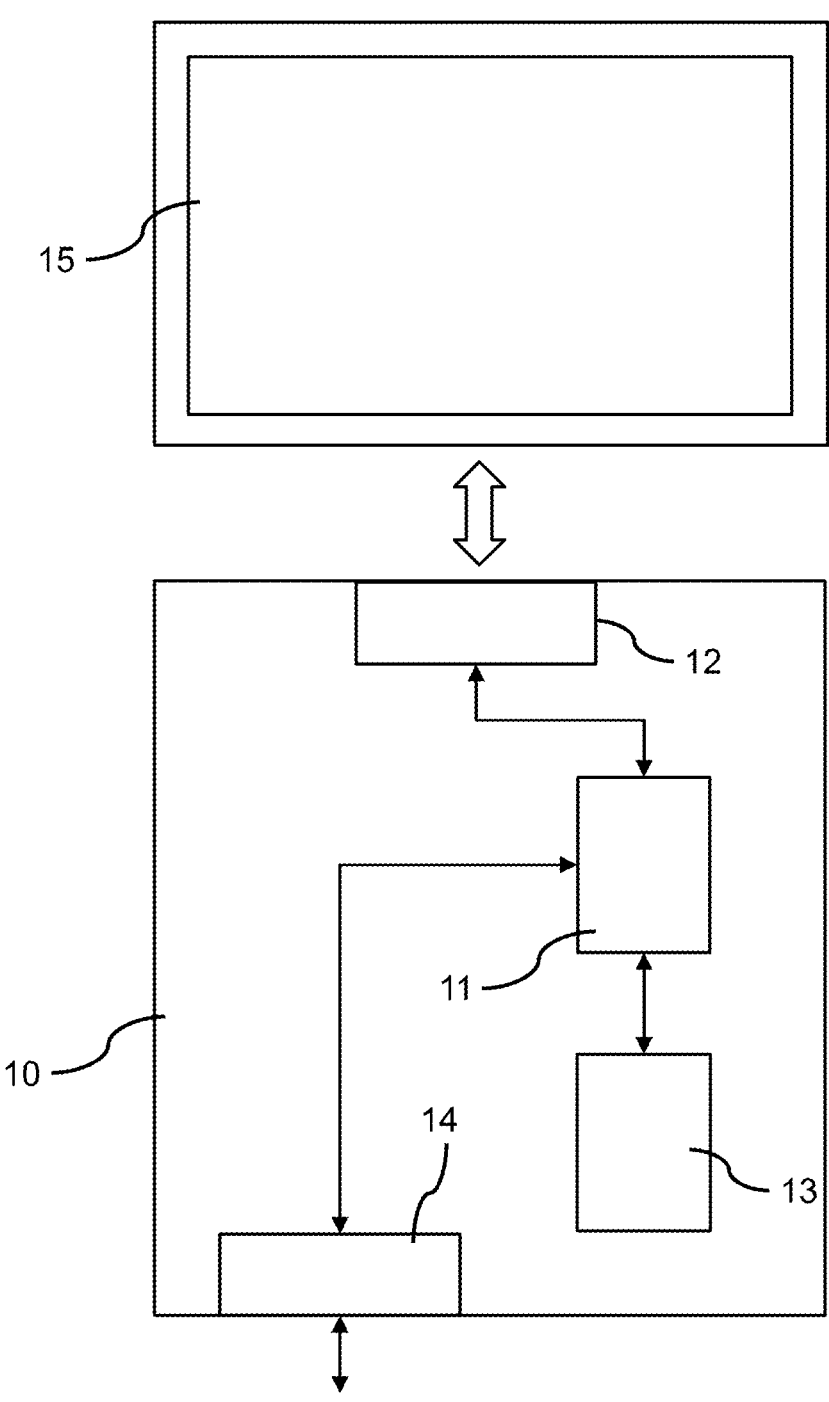

FIG. 1 schematically shows a computing device 10 according to an embodiment. The device 10 comprises a processing unit 11, an I/O interface 12 and a memory 13. The processing unit 11 is arranged to read and write data and computer instructions from the memory 13. The processing unit 11 is also arranged to communicate with sensors and other equipment via the I/O interface 12. The device 10 may also comprise an interface 14 arranged to communicate with other devices via a LAN or WAN (not shown). FIG. 1 also shows a display 15 which may be connected to the interface 12 so as to show information regarding a slicing process of a 3D object. The memory 13 may comprise a volatile memory such as ROM, or a non-volatile memory such as a RAM memory, or any other type of computer-readable storage. The memory 13 may comprise a computer program product comprising code configured to make the processing unit 11 perform one or more of the embodiments of the method as described below.

Figure 2:
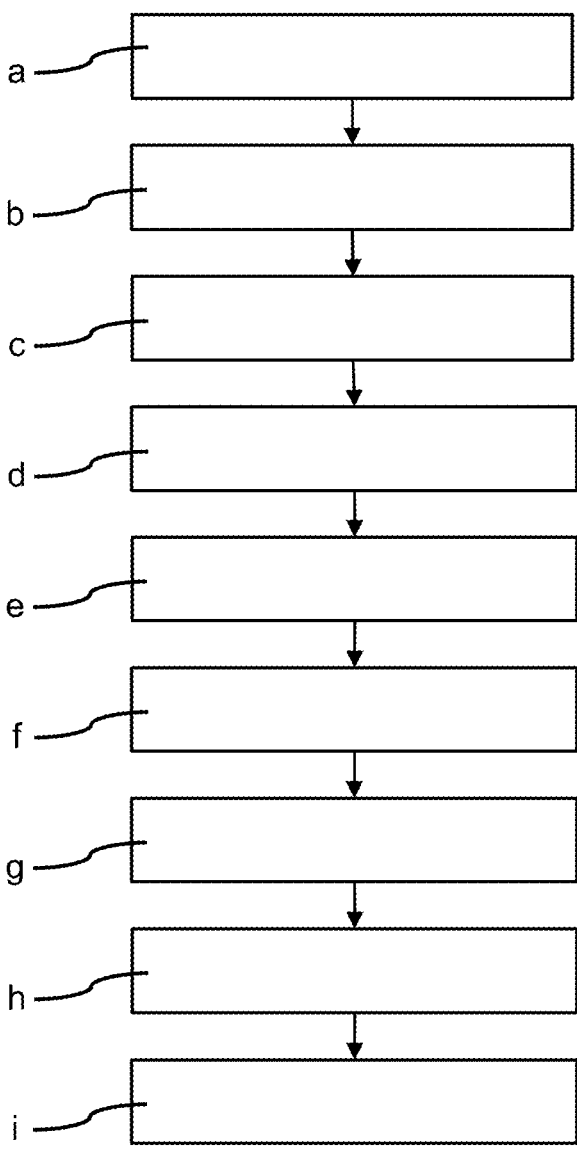
FIG. 2 shows a flow chart of the method according to an embodiment.

FIG. 2 shows a flow chart of the method of determining toolpaths for an infill structure for a digital 3D model, according an embodiment of the invention. The method comprises a step (a) of receiving a polygon, the polygon representing an outline of a layer of the digital 3D model. Then the method comprises a step (b) of computing a skeleton using a medial axis of the polygon, the skeleton comprising a plurality of nodes and edges connecting the nodes. Next, the method comprises a step (c) of determining, for each node v, a feature radius value, where the feature radius of a location on the skeleton is defined as the radius of an inscribed circle centered at the location. Then the method comprises a step (d) of marking of some of the edges using a significance criterium to obtain marked edges, leaving edges not marked as being unmarked edges, and defining marked nodes as those nodes which are connected to a marked edge and unmarked nodes as being those nodes that are not connected to any marked edge. Next, the method comprises a step (e) of assigning each marked node in the skeleton an bead count value b, which is defined as a number of beads to fit along a diameter of the inscribed circle centered at the respective marked node. Furthermore, the method comprises a step (f of assigning to each marked node, a bead distribution B, defined as the combination of a location list L of feature radii values and a bead width list W of bead widths, for which the location list and bead width list have a size of at least half of the bead count b assigned to that marked node. In a step (g) each unmarked node is assigned a bead distribution B which is based on the bead distributions of nodes connected to the unmarked node via an edge of the skeleton. And in a step (h) on each unmarked edge, junctions are determined at those locations along the unmarked edge where the feature radius corresponds to any of the feature radii values in the location list of the node with the higher feature radius value of the two nodes connected to the respective unmarked node and assigning to each of the junctions a corresponding bead width out of the bead width list W. Finally a step (i) follows of filling the polygon with toolpaths, the toolpaths passing through the junctions and having a variable width defined by the assigned bead widths.

Given arbitrarily shaped polygons which represent the 2D outline of a layer of a 3D model, the proposed method generates extrusion toolpaths with varying width, i.e. a set of polylines where each site consists of a location and an extrusion width. In between the sites a linear interpolation of the position and extrusion width may be performed.

Embodiments of the method will now be described in more detail with reference to the FIGS. 3-12. In the following it will be discussed how we can generate toolpaths using our framework with uniform bead widths and evenly distributed locations between the centre of the polygon and the outline. Next to such a relatively simple beading scheme, more advanced beading schemes will be described.

Figures 3A, 3B, 3C, 3D:
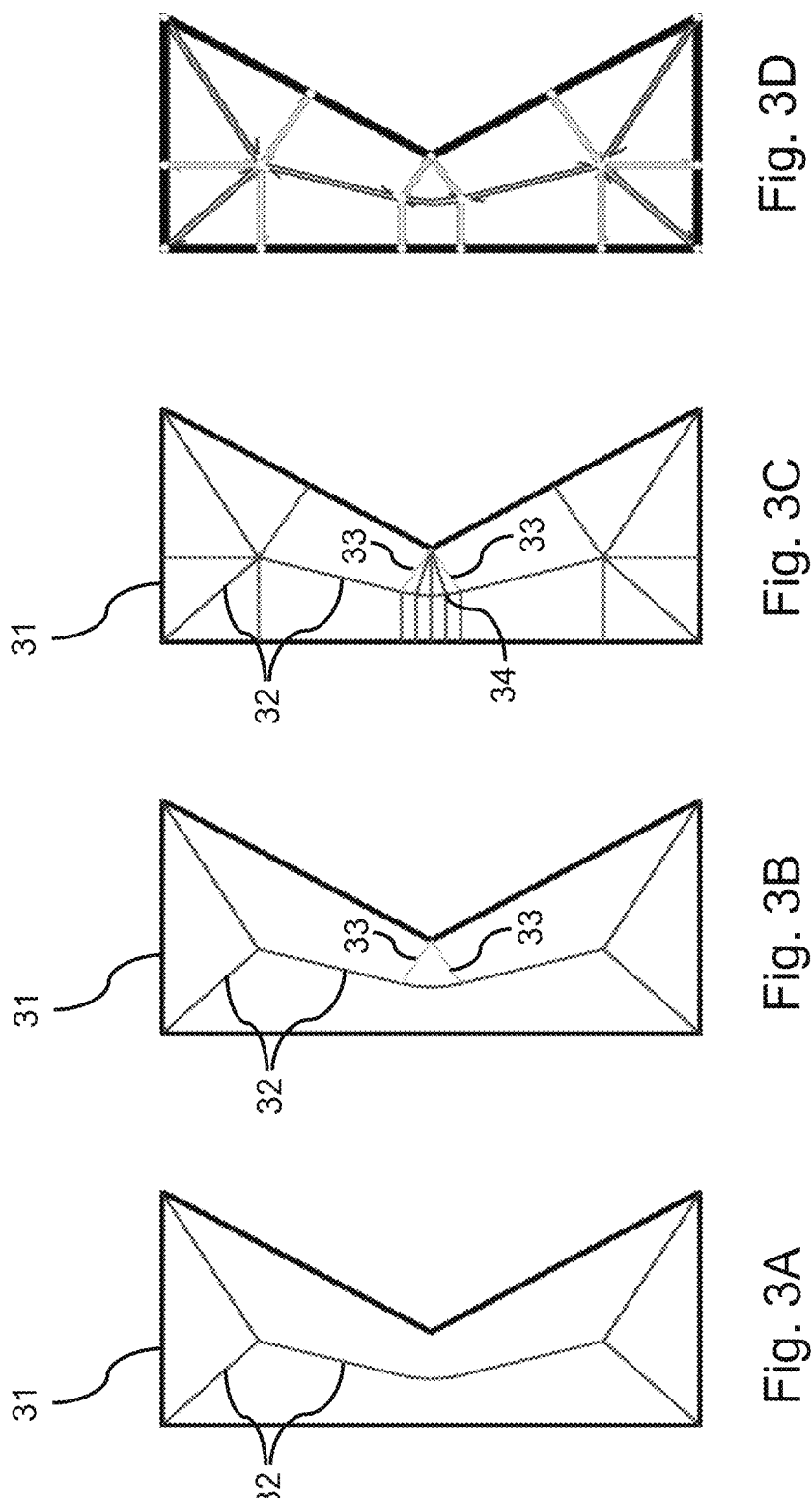
FIGS. 3A-3D show an example of a polygon and its skeleton.

After receiving an input polygon, the method proceeds with computing a skeleton using a medial axis (MAT) of the polygon, wherein the skeleton comprises a plurality of nodes and edges which connect the nodes. The medial axis is a compact and complete representation of a shape. It is defined as the set of positions where the inscribed circle meets the boundary in at least two locations [32, 33]. The resulting skeleton consists of straight edges and parabolic edges. An example is illustrated in FIG. 3A in which an input polygon 31 and a medial axis 32 is shown. We call the set of points on the outline polygon P closest to a skeletal point v its support sup(v) with:

$$sup(v) = \underset{x \in P}{\text{argmin}} |x - v|. \tag{1}$$

The shortest distance for a point on the skeleton is called its feature radius, R(v). The medial axis along with the feature radius values along the skeleton form a complete shape descriptor, known as the MAT. Starting from the medial axis 32 we decompose the input polygon into a set of quads and triangles, so that we can perform the slicing stage on simple shapes. We employ a shape decomposition similar to the one proposed by Ding et al. [7]. The basic idea is to add edges connecting each node v on the medial axis to each of its support points sup(v). The resulting skeleton decomposes the outline shape into trapezoids and triangles. Considering the fact that the concept of trapezoidation conventionally allows for the degenerate case where a trapezoid resolves into a triangle [34, 35], we call this shape decomposition the Skeletal Trapezoidation (ST).

The edges generated by the MAT are classified into three types: 1. line-line edge—straight edge generated from two line segments in the outline polygons, 2. vertex-line edge—parabolic edge resulting from an outline vertex and a line segment in the outline, and 3. vertex-vertex edge—straight edge resulting from two outline vertices. The vertex-line and vertex-vertex edges are discretized into pieces with a length up to $d^{discretization}$. This allows to approximate the feature radius between two discretized nodes $v_0$ and $v_1$ by linear interpolation. Again, we connect the newly inserted nodes to their support, which results in vertex-line regions and vertex-vertex regions.

We assign each node in the ST a (real number) value measured in terms of beads, referred to as the bead count b. We define the bead count as the number of beads to fit along the diameter of the inscribed circle centered at node v, i.e. 2R(v), by $$\tilde{b}_v = 2R(v)/w^* \tag{2}$$

where w* is the nozzle size and R(v) the feature radius. We divide the diameter rather than the radius as this allows to deal with an odd number of beads while using integer logic.

Actually, the medial axis of a polygonal shape is a subset of the Voronoi Diagram (VD) generated from the line segments and vertices of the shape [33]. The edges of the Voronoi diagram that fall outside of the outline shape (i.e. the polygon 31) are irrelevant for our purpose and thus discarded. Note that besides the full medial axis, the Voronoi diagram also contains edges 33 connecting to concave vertices in the outline shape 31, see FIG. 3B. These extra edges 33 are a subset of the edges connecting a node to its support, so we keep them in. From the Voronoi diagram we add nodes 34 to discretize parabolic edges and edges formed by two concave outline vertices, and then connect all nodes to their supports, forming a skeletal trapezoidation, see FIG. 3C. We then assign each node the bead count values using equation (2). We computed the Voronoi diagram using the Boost C++ libraries [36], which implements the algorithm proposed by Fortune [37]. A half-edge data-structure was used to represent the Voronoi diagram, see also FIG. 3D.

In order to prevent over- and underfill to occur in central areas, some parts of the ST may be marked as being so-called marked edges, also referred to as central edges. The remainder of the ST is then called unmarked edges. In the proposed method a bead distribution B is determined at all the marked nodes in 'the centre' and this bead distribution is then applied outward to the unmarked nodes. It is noted that in the following the beading distribution B is simply referred to as the beading B.

A node in the ST may be marked as central if its feature radius is larger than that of all its neighbouring nodes, i.e. a local maximum. Also, an edge may be marked as being central if it is significant according to a significance measure.

Figure 4A:
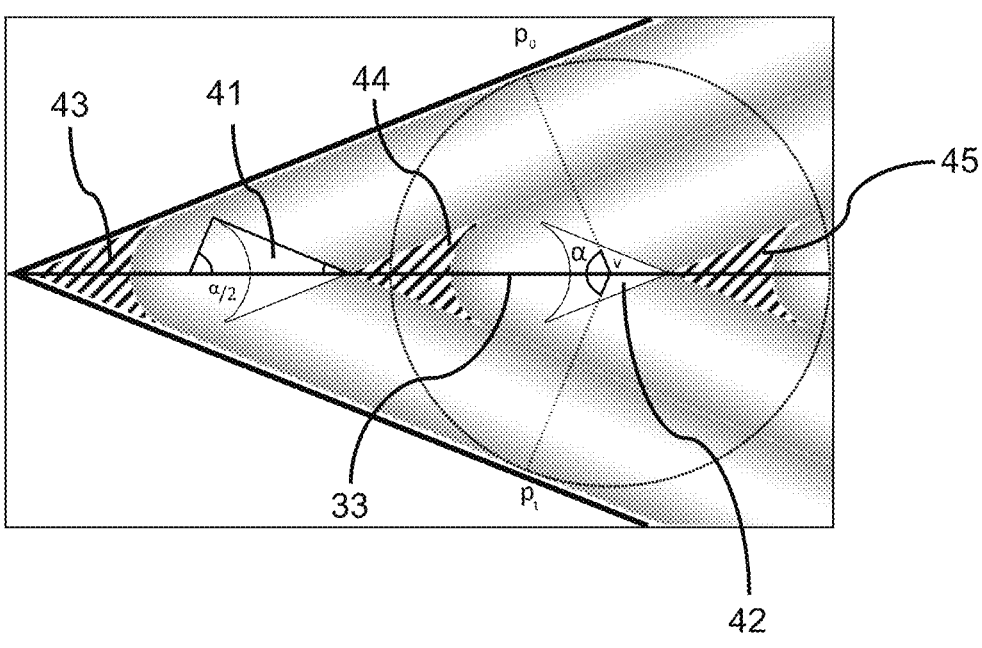
FIG. 4A shows a polygon with a pointy wedge area with overfill and underfill.
Figure 4B:
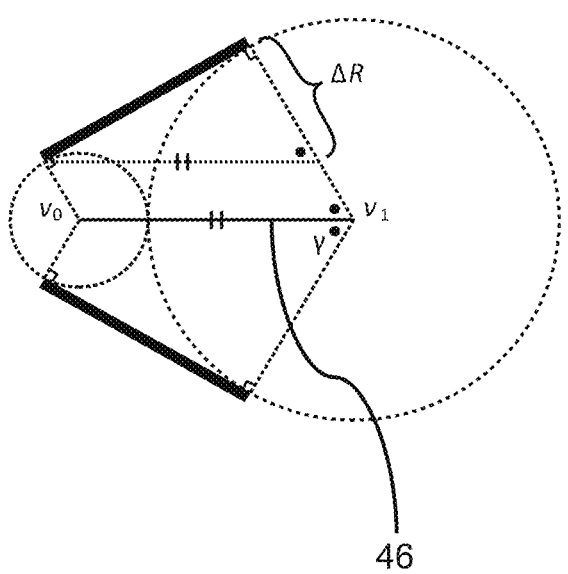
FIG. 4B shows a sketch with angles to explain the calculation of a significance measure.

Reference is now made to FIG. 4A to explain how a significance value S of an edge can be determined. FIG. 4A shows a polygon with a wedge-shaped area. It also shows a node $v_1$ having two supporting points $p_1$ and $p_0$. In an embodiment, we make use of the bisector angle as an indicator of significance. The bisector angle a is the interior angle $\langle \rho_0 / \rho_1 \leq 180°$, between any location/on an edge of the ST and its two supporting points $\{\rho_0, \rho_1\}=\sup(l)$ [38]. An edge is significant if the bisector angle on any location on the edge exceeds a prescribed $\alpha_{max}$. As illustrated in FIG. 4A, for a polygon with a pointy wedge area of an angle β, we have $\alpha=180°-\beta$. This corresponds to the overfill areas 41, 42 and the (dashed) underfill areas 43, 44, 45 the size of $1/4(w^*)^2 (\tan(\alpha/2)-a/2)$ when filled using the simple technique of uniform bead width equal to the nozzle diameter w*. A too large $\alpha_{max}$ may leave a lot of under-/overfill, while a too small value may introduce toolpaths to fill in negligibly small underfills. In an embodiment, values of $\alpha_{max}$ lie in a range 100°–150°. A typical value for $\alpha_{max}$ is 135°. These values gave good results.

Although significance measures are commonly used as a heuristic for finding the parts of a skeleton which are in some sense relevant [38, 39], we use the bisector angle as an exact indicator of the amount of overfill and underfill in the uniform toolpaths of constant width. To avoid evaluating the bisector angle at any location on all edges, we devise an efficient measure which operates only on the two nodes of an edge. Because all locations along a line-line edge 46 between two node $v_0$ and $v_1$ have the same bisector angle, see also FIG. 4B, we can evaluate whether the edge 46 is significant by checking whether the following holds where R(.) is the feature radius function and $\alpha_{max}$ is the bisector angle significant limit.

For vertex-line edges and vertex-vertex edges only a portion of the edge is significant. We therefore introduce nodes at the boundaries of the significant portion during the discretization of such edges. The significance of all edges can then accurately be evaluated using equation (3).

After initializing the marking at all edges and nodes, we may filter out high frequency changes in the marking in order to ensure that the generated toolpath is smooth. The filtering can be performed by additionally marking some unmarked elements, rather than the opposite since unmarking central regions reintroduce large over- and underfill areas. From each marked node $v_0$ with an upward unmarked edge attached we walk along the upward edges; if the total length traversed until we reach another marked node $v_1$ is shorter than some filter distance $$d_{max}^{unmarked},$$

we mark all edges encountered as being central.

Now that we have identified and marked the central regions, we quantize their beat count values. We first quantize the initial bead count h into an integer bead count 6 at the marked nodes using a quantization operator q, then find the locations along the edges where q makes a jump from one bead count on to another n+1 and then introduce ramps to smoothly transition from n to n+1 using fractional bead counts b along the smooth transition.

A simple shape (i.e. polygon) is shown in FIG. 5A-5D to explain the steps of applying bead counts and transitioning on shape. FIG. 5A-5D show graphs of a polygon 51 with straight edges at the top and a mirrored version at the bottom which edges comprise small perturbations. FIG. 5A shows central edges 52 in black and also some grey lines representing the support edges of the skeleton. Also, at each marked node, a bead count is depicted. From FIG. 5A, the difference between a simple skeleton (top) and a mirrored version with small perturbations in the outline (bottom) is visible. In an embodiment, we first initialize the bead counts in the marked edges 52, see FIG. 5A. We then extract the anchor locations where the bead count transitions, see FIG. 5B. We then filter out regions which exhibit frequent transition, see FIG. 5C. We then calculate the end locations of the transitions and modify the bead count at nodes in between to fractional values, see FIG. 5D. Finally, we introduce nodes at the ends and introduce radial edges as per the trapezoidation constraint, see FIG. 5E in which the grey areas indicate transition areas. The symmetry in FIG. 5E shows that transitioning is robust against small perturbations in the outline shape.

The proposed method also comprises quantising for each marked node in the skeleton the initial bead count b into an integer bead count $\overline{b}$ using a quantization operator q. In an embodiment, we define the quantization operator q to map a feature diameter (d=2R(v)) to a bead count, so q: R→N. Because our quantization scheme should round to the nearest integer multiple of the nozzle size, we have q(d)=[d/w*+ 1/2], where the square brackets [ ] stand for the rounding-off function. Alternative quantization schemes are discussed below. By applying q to the bead count of central nodes we quantize the bead count:

$$|R(v_1) - R(v_0)|/|v_1 - v_0| > \cos(\alpha_{max}/2) \qquad (3)$$

$$\overline{b}_v = q(2R(v)) = \left[\tilde{b}_v + 1/2\right] \qquad (4)$$

11 with $\bar{b}_v$ the quantized bead count, q the quantization operator, R the feature radius function and $\sim_v$ the initial bead count.

In an embodiment, the method comprises determining on each of the marked edges (i.e. the central edges) one or more anchor points using the bead count of the associated nodes. For a marked edge which connects nodes $v_0$ and $v_1$ with $\bar{b}_{v0} \leq n < \bar{b}_{v1}$, we may determine the transition anchor locations at which the bead count transitions from n to n+1. To this end, we introduce the function $$q^{-1}(n) := \arg_d \max q(d) = n \qquad (5)$$

which gives the feature diameter d at which the bead count q transitions from n to n+1. The location of the anchor v, can then be computed by inversely interpolating $R(v_x)=q^{-1}(n)$, i.e.

$$v_x = v_0 + (v_1 - v_0)\frac{q^{-1}(n) - R(v_0)}{R(v_1) - R(v_0)} \qquad (6)$$

An illustration of the anchors is shown in FIG. 5B, see for example 4→5 which is an anchor point where the bead count transitions from 4 to 5.

We may perform a filtering step to prevent frequently changing the bead count back and forth within a short distance. For two consecutive anchors which transition to opposite directions, if the distance between them is smaller than some limit $$d_{max}^{transition},$$

the bead counts at all nodes in-between are set to the surrounding bead counts, and consequently these anchors can be removed, see FIG. 5C.

A sharp transition from n to n+1 beads at an anchor location creates sharp turns in the toolpath, see the example of FIG. 6A in which dashed lines indicate the determined toolpaths. We may introduce a transition length t(n) to ensure a smooth transition. The result is shown in FIG. 6B where the sharp turns of FIG. 6A are prevented by the transition regions, see dark grey areas 62, 63, 64.

In an embodiment, the length of the transition is set to t(n)=w* and it is centered at the anchor, i.e. the distance from the lower end $v_0$ to the anchor position $v_x$ is set to $t_0(n)=\Delta(v_0v_x)=t_0(n)(q^{-1}(n)/w*-n))$, where $\Delta$ is the total distance along the edges between two nodes. We may discard any transition anchor which is too close to the end of a chain of marked edges for the smoothed transition to fully fit within the marked region. In order to make the transition ramps robust against small perturbations in the outline shape which cause extra (support) edges in the skeleton, we may modify the nodes $v_x$ which are between the two ends $v_0$ and $v_1$ of the transition by (re-) assigning them a fractional bead count b which is linearly interpolated between the two ends of the transition (see FIG. 5E):

$$\hat{b}_{vx} = n + \Delta(v_0 v_x)/\Delta(v_0 v_1) \qquad (7)$$

12 with $\hat{b}_{vx}$ the fractional bead count, n the lower bead count (integer), $v_0$ the lower end, $v_x$ the upper end and v, the anchor position.

Note that although the skeleton might not be stable against noise in the boundary shape, the distance field itself is, so by designing our algorithms such that they are stable against changes in the topology of the skeleton our method is stable against small perturbations in the outline. Finally, we update the skeleton (ST) by adding support edges at the transition ends.

Now that the bead counts in the central regions are determined, it will be discussed how the unmarked regions can be handled. Determining bead count values for the unmarked nodes and interpolating linearly along the unmarked edges would mean that toolpath sites would be distributed evenly along each unmarked bone; while that would suffice for the evenly distributed beading scheme, it wouldn't allow for more sophisticated, non-linear schemes. Instead we determine the radial distance to the boundary at which each bead should occur from the boundary to the center. Each central node is associated with a sequence of radial distances L which control the locations of the beads, starting from the outer bead and ending in the center. Together with a sequence of bead widths W these form what we call a beading scheme B. For our distributed beading scheme, we compute the beading for a central node v with $$n = [\hat{b}_v]$$

beads and a diameter r=R(v) as:

$$B(n, r) = (W(n, r), L(n, r)) = (\{w_0 \dots w_{[n/2]-1}\}, \{l_0 \dots l_{[n/2]-1}\}) \qquad (8)$$

$$w_i = r/n \qquad \text{for all } i \in N: i < n/2$$

$$l_i = r/n(i + 1/2) \quad \text{for all } i \in N: i < n/2$$

where $w_i$ and $l_i$ are the width and location of the i-th bead, respectively, counting from the outline inward.

Figure 7A:
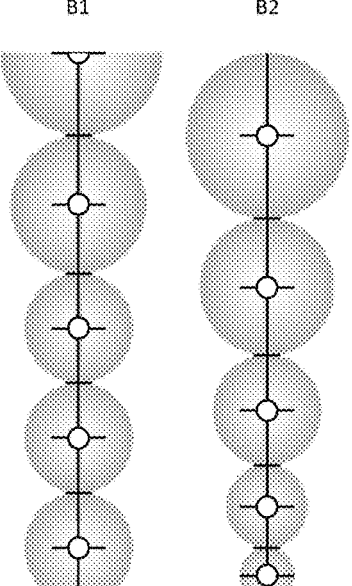
FIG. 7A shows a beading scheme for an odd and even bead count with arbitrary widths.
Figure 7B:
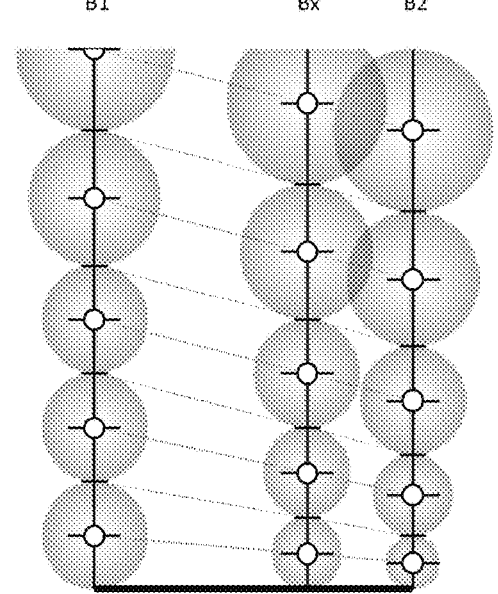
FIG. 7B shows a possible interpolation between two beadings $B^1$ and $B^2$ of FIG. 7A with odd and even bead count.

Example beading schemes for an odd and even bead count with arbitrary widths are visualized in FIG. 7A. FIG. 7B shows a possible interpolation between two bead distributions $B^1$ and $B^2$ with odd and even bead count resulting in a bead distribution B* at n+2/3. Bead indices are counted inward from the outline (thick black). The interpolation of locations is shown by white dots, and the interpolation of widths is shown by dashed lines.

Figure 8A:
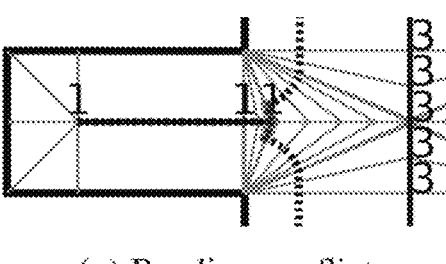
FIG. 8A shows a part of a skeleton wherein a beading conflict occurs.
Figure 8B:
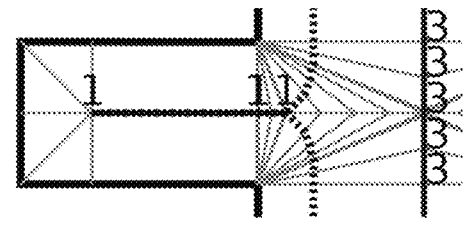
FIG. 8B shows the part of FIG. 8A wherein this beading conflict is resolved by gradually interpolating between the two beadings.

The beading scheme is defined in terms of an integer number of beads, while we have assigned a fractional bead count to nodes within a transition region. In order to generate a beading for a node v with $n < b_v < n+1$ we linearly interpolate the bead widths and locations between a bead distribution $B^1$ based on n and a bead distribution $B^2$ based on n+1, see also FIG. 7B. Such interpolation is also used to deal with beading conflicts, an example of which is shown in FIG. 8A. There we may also apply beading interpolation from a marked node $v_m$ upward along unmarked bones, and interpolate between $v_m$ and the beading at the top of the slope over some distance $t_{beading}$ from the lower marked node. FIG. 8A shows a part of a skeleton wherein a beading conflict occurs, i.e. the bead distribution propagated from right part of FIG. 8A conflicts with the bead distribution of the left part of FIG. 8A. In FIG. 8B this beading conflict is resolved by gradually interpolating between the two bead distributions.

Once the beading at the marked nodes is determined, the beading information can be broadcasted (i.e. used) throughout the ST from central regions outward, so that each unmarked node v knows the beading of an associated marked node. We first broadcast the beading information upward from all marked nodes, so that we can then deal with beading conflicts in a downward phase. This downward phase makes sure that all nodes have a beading associated with it, so that the slicing algorithm can efficiently slice the edges leading up to a marked or unmarked node.

Once each node has been assigned a beading we can proceed to generate the toolpath sites along the edges of the ST. A site S consists of a location v a width w and an index i, which are computed for an edge $v_0 v_1$ from the bead distribution B of the upper node $v_1$, with $v_0$ being the lower node, wherein lower means having a lower feature radius:

$$S = \{v, w, i\} \tag{9}$$
$$v = v_1 + (v_0 - v_1) \frac{R(v_1) - l_i^B}{R(v_1) - R(v_0)}$$
$$w = w_i^B$$

for any i for which $$R(v_0) < l_i^B \leq R(v_1),$$

with $$w_i^B \text{ and } l_i^B$$

the width and location of the $i^{th}$ bead in the bead distribution B, respectively, counting from the outline inward.

Figures 9A, 9B, 9C, 9D, 9E, 9F:
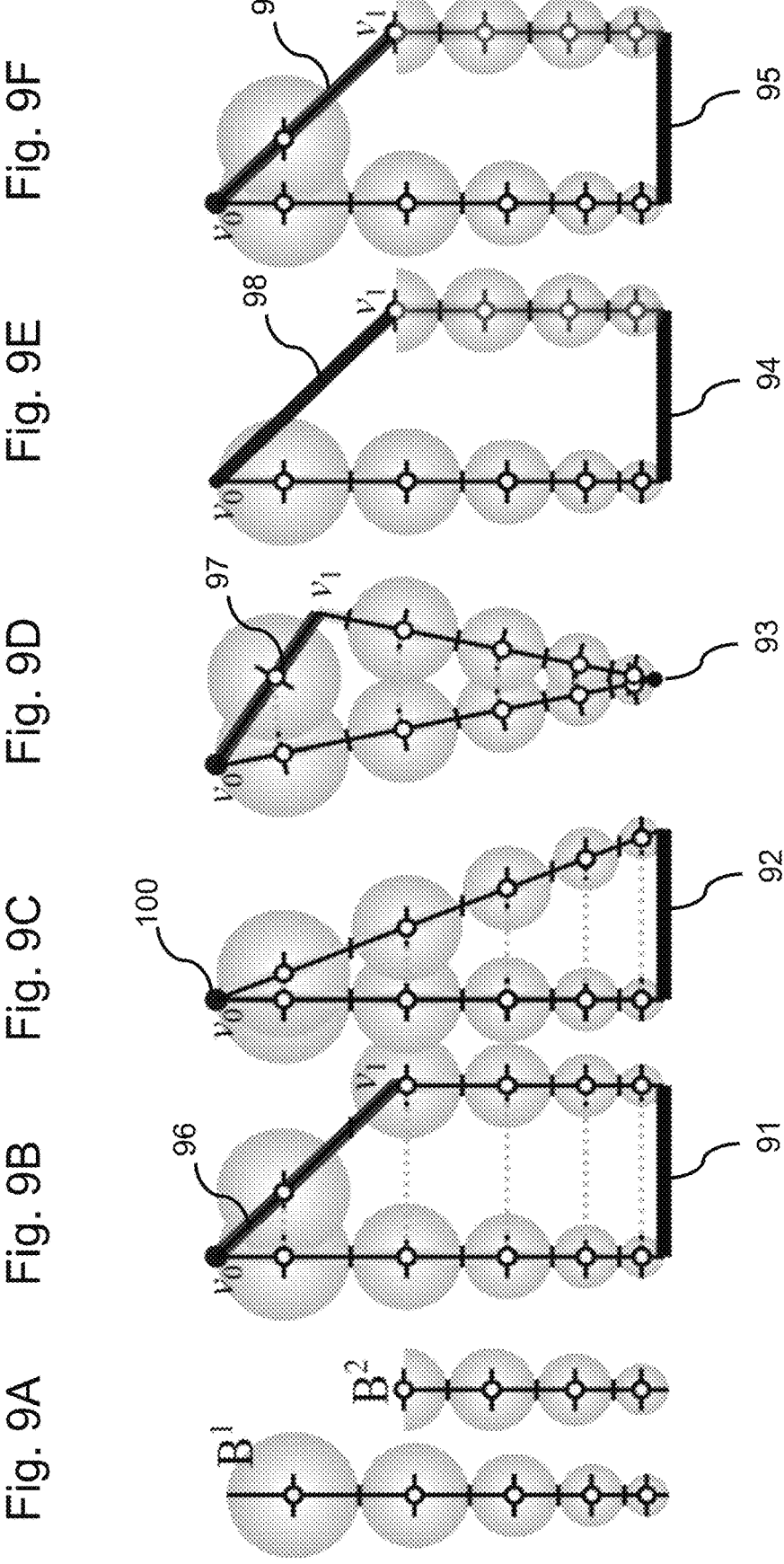
FIG. 9A shows an example of the locations $I_i$ and widths $w_i$ of two arbitrary different beadings.
FIG. 9B-9D show the application of $B^1$ to the various types of trapezoid.
FIGS. 9E and 9F show how a trapezoid with a marked edge will have two different beadings assigned.

FIG. 9A shows an example of the locations $l_i$ and widths $w_i$ of two arbitrary different beadings. FIG. 9B-9D show the application of $B^1$ to the various types of trapezoid. FIGS. 9E and 9F show how a trapezoid with a marked edge will have two different beadings assigned, which will generate their respective sites along the support edges. In FIGS. 9B-9F show the outline segments 91, 92, 93, 94, 95. 98 shows a marked edge, while 96, 97 and 99 show an unmarked edge. $v_0$ shows a marked node in FIGS. 9B-9F, while $v_1$ is only marked in FIGS. 9E and 9F.

In FIGS. 9B-9D, the dashed lines show wave fronts of equidistant radial distance at $R=l_r$. It is noted that in this example no sites (i.e. junctions) will be generated along marked edges.

In an embodiment, all sites of an edge are stored in a mapping from the edge to a list of sites. We then generate extrusion segments for each trapezoid by connecting together the sites of the same index. If the number of sites on both sides of the trapezoid is not the same, then this trapezoid is in a transition and we leave one inner site unconnected.

Because the bead count is defined in terms of the feature diameter rather than the radius, only some of the bead count values b* in a central region coincide with a slicing height. When the bead count b* is even, the ridge is sliced as normal; the intersection between a slicing plane and the mesh surface results in a polyline on both sides of the ridge, which are connected together into a polygonal toolpath. When the bead count b* is odd, the ridge will coincide exactly with a slicing height, which results in a single polyline toolpath being generated along the middle of the feature. In that case we should prevent the algorithm from generating the center extrusion segment twice from the trapezoids on either side of that segment. We therefore use some arbitrary condition to decide which one of the two to include based on the ordering of the coordinates of $v_0$ and $v_1$: $x_0 < x_1 v (x_0 = x_1 \wedge y_0 < y_1)$.

Figures 10A, 10B:
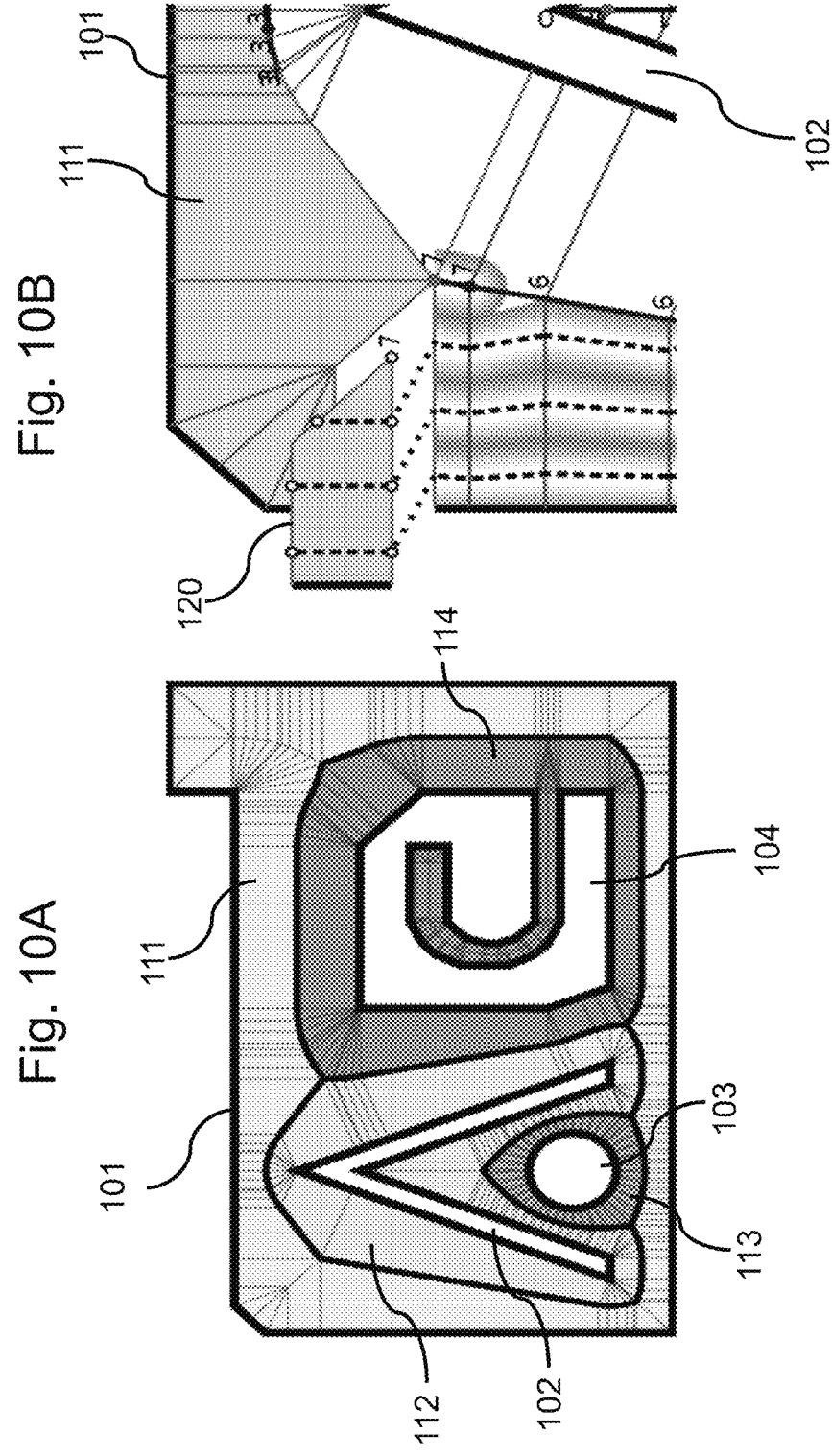
FIG. 10A shows an example of a test polygon with a skeleton divided into regions.
FIG. 10B shows a detail of a top left corner of FIG. 10A.

FIG. 10A shows an example of a test polygon 101 with a skeleton (ST) determined using the above described method. FIG. 10B shows a detail of a top left corner of FIG. 10A. The example of FIGS. 10A and 10B contains three cavities 102, 103, 104 to provide for a more challenging shape to slice.

In FIG. 10A, all trapezoids in the ST are assigned to separate domains 111, 112, 113, 114 indicated using different shades of grey. The domains 111, 112, 113, 114 correspond to which boundary polygon they are connected to. By traversing the trapezoids per domain in order, we can efficiently connect all segments into polylines. In a final step the ends of polylines are connected together, so that the final toolpaths contain both polygons and polylines, see FIG. 10B.

In other words, toolpaths on a part of the test polygon are generated by chaining together extrusion segments along each polygon domain. Each edge of the ST is assigned toolpath sites which are connected together as shown in the singled out trapezoid 120 in FIG. 10B. By following the trapezoids along the domain of a single outline polygon, the extrusion segments (see dashed line segments) can efficiently be chained into polyline toolpaths.

Around the transition locations and around nodes with odd bead count and more than two marked edges attached, there will be intersections in the toolpaths. Such intersections cause overfill because the nozzle passes the location multiple times. In an embodiment, we deal with this special case by forcing a new polyline when traversing the trapezoids, and in the final polyline connection step we may connect the first two polylines ending in the same location and retreat all other polylines ending in that same location in order to prevent the overfill. In order to retreat a polyline which ends in a site S we may remove part of the polyline paths up to the intersection by a distance of $w_s d_{max}$, where $d_{max}$ is some ratio between 0 and 1. This ratio effectively deals with the balance between overfill and underfill generated at that location after the retreat has been applied.

Figure 11A:
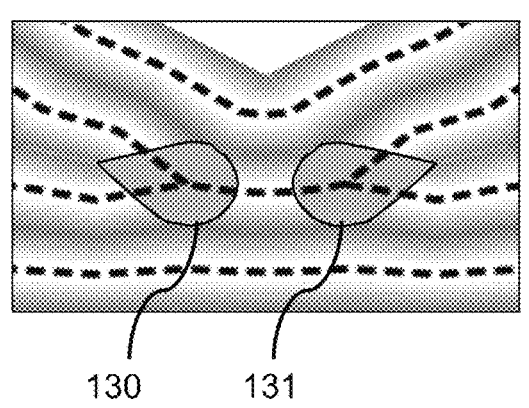
FIG. 11A shows an example of a number of toolpaths wherein regions of overfill occur at certain intersections.
Figure 11B:
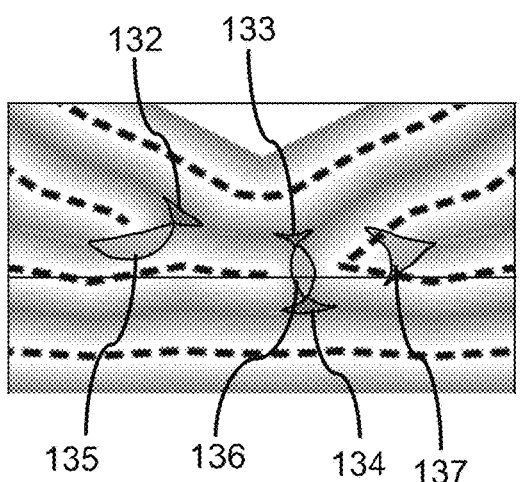
FIG. 11B shows an example of a similar print wherein some or all overfill is prevented by reducing polyline toolpaths away from the intersections.

FIG. 11A shows an example of a number of toolpaths wherein regions of overfill 130, 131 occur at certain intersections. By reducing polyline toolpaths away from the intersections some or all overfill can be prevented, also see FIG. 11B in which toolpaths are shown as thick dashed lines, underfill areas are indicated by numbers 132, 133 and 134, and overfill areas are indicated by numbers 135, 136 and 137.

An important component in toolpath generation is how to distribute the beads over the feature radius. While the embodiments presented above take evenly distributed beads as an example, the proposed method also allows to apply different beading schemes to configure the bead distribution to cater for specific requirements from the application, 3D printer or material.

A beading scheme is defined by the quantization operator q and the beading operator B: {q(d), B(n,r)}. The beading function B(n,r) consists of (W(n,r), L(n,r)), which provides sequences of n bead widths and of n distances from the outline to fill up a radial distance r.

For the smoothness and continuity of toolpaths we require that $w_n$ is monotonic and continuous at each bead index n for constant bead count $$c : 0 \leq \frac{\partial W(c, r)_n}{\partial r} \leq 1.$$

Preferably the beads don't overlap and are extruded from the center of where they end up. It is also preferred that odd bead counts produce a single polyline toolpath exactly in the center by determining the bead locations from the widths:

$$L(n, r)_i = \frac{-1}{2} W(n, r)_i + \sum_{j=0}^{i} W(n, r)_i \text{ if } i < \frac{1}{2}(n-1) \quad (11)$$

$$r \text{ if } i = \frac{1}{2}(n-1) \quad \quad 20$$

with $L(n, r)_i$ and $W(n, r)_i$ the location and width of the $i^{th}$ bead for a beading of n beads in a radial distance r.

In the following several different beading schemes are described which determine the bead count and their widths in various ways. We can emulate a variety of toolpath generation methods from related literature by defining new beading schemes. We also introduce new beading schemes which produce toolpaths with less extreme widths compared to techniques from existing literature.

Uniform beading scheme. We can define a beading scheme which emulates the uniform width offsetting technique by disabling the marking of edges, so that we never employ transitioning. We can simply set $\alpha_{max}=180°$ and supply a beading scheme given by:

$$q^-(d) = 2\text{round}\left(\frac{1}{2} d / w^*\right) \quad (12)$$

$$W(n, r)_i = w^* \text{ for all } i$$

Outer bead. We can emulate the method from Moesen et al. by carefully choosing how the beading scheme functions deal with the outermost bead. Also, we turn off the reduction of toolpaths near 3-way intersections $d_{max}=0\%$, so that the polygonal toolpaths emulate the remaining area to be filled by another path planning technique similar to their technique. We don't need transitioning, so we also set $t(n)=0$. This beading scheme is given by:

$$q(d) = C \quad (13)$$

$$W(n, r)_i = 2r / n \text{ for all } i$$

Constant bead count. We can emulate the method from Ding et al. by dividing the feature radius over the widths of a constant number of beads. Additionally, in order to emulate their definition of "branches" we mark all ST edges ($\alpha_{max}=0°$) we unmark the outer edges connected to the outline shape in a separate algorithm. Note that this deviation from the proposed framework violates the robustness against small perturbations in the outline polygon, since this marking depends on the topology of the graph of the ST. This beading scheme is given by:

$$q(d) = 1 \text{ if } d < w^* \text{ and } 2 \text{ otherwise} \quad (14)$$

$$W(n, r)_i = 2r \text{ if } n = 1 \text{ and } w^* \text{ otherwise}$$

Centered. We can emulate the method from Jin et al. by transcribing how they deviate from the uniform width toolpaths. We therefore base the beading scheme on the bead count $q^-(d)$ defined by the uniform beading scheme. Jin et al. replace two beads from the uniform toolpaths by a single one when the radius between the center and either of those beads falls short of $r_{ain}=0.8w^*$, which gives us $w_{max}=1.8w^*$. Conversely, they place an extra bead when the radius exceeds $r_{max}=1.25w^*$ [9], which gives us $w_{min}=0.5w^*$. We emulate the rounded polygonal path rerouting they define by supplying a transition length $t(n)=1/2w^*$ which results in a discretized version of the rounded polygon segment. This beading scheme is given by:

$$q(d) = q^-(d) + \begin{cases} -1 & \text{if } q^-(d)w^* - d > w^* - r_{max} \\ 1 & \text{if } q^-(d)w^* - d < w^* - r_{min} \\ 0 & \text{otherwise} \end{cases}$$

$$W(n, r)_j = \begin{cases} 2r - (n-1)w^* & \text{if } i = \frac{1}{2}(n-1) \\ w^* & \text{otherwise} \end{cases}$$

Evenly distributed. By taking the advantages of the above two schemes we can define a beading scheme which constitutes a novel tool pathing technique. We can evenly divide the local feature diameter over the widths of all beads, but choose a local bead count better matching the local feature size. We determine the local bead count by dividing the diameter by the preferred bead width and rounding to the nearest integer. This reduces the demands on the system and deviation from mechanical properties caused by beads with extreme deviations from the preferred width. This beading scheme is given by:

$$q(d) = \text{round}(d / w^*)$$

$$W(n, r)_i = 2r / n \text{ for all } i$$

Inward distributed scheme. The evenly distributed scheme can be conceptualized as calculating the total discrepancy E between the actual feature diameter d and the total preferred width nw*, dividing the total discrepancy by the number of beads and setting the width of each bead to w*+E/n. However, depending on the application we might want a different distribution of widths. We therefore supply a beading scheme which supports an arbitrary distribution of the discrepancy. The distribution is determined by some weighing function w(n,r), which defines the portion of the discrepancy to distribute to each bead:

$$q(d) = \left\lfloor \frac{d}{w^*} + \frac{1}{2} \right\rfloor$$

$$W(n, r)_i = w^* + E(n, r) \frac{\omega(n, r)_i}{\sum_{j=0}^{n-1} \omega(n, r)_j} \text{ for all } i$$

$$E(n, r) = 2r - nw^*$$

$$\omega(n, r)_i = \max\left(0, 1 - N^{-2}(i - (n-1)/2)^2\right)$$

Figure 12A:
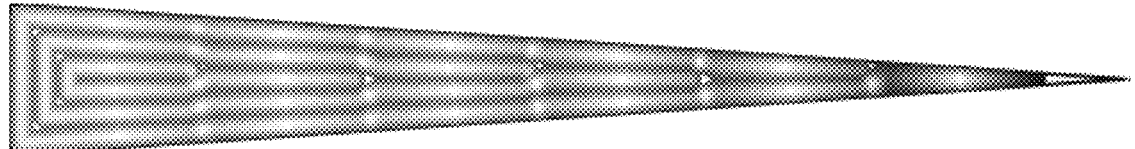
FIG. 12A shows a closeup of toolpaths generated with an evenly distributed beading scheme for a large wedge shape.
Figure 12B:
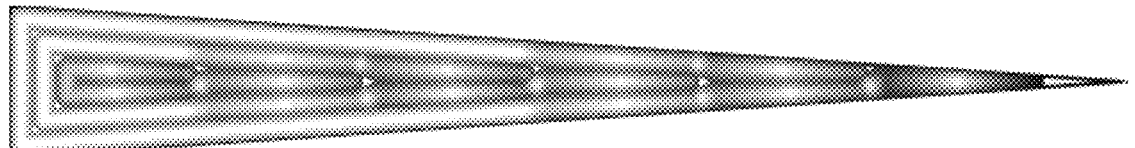
FIG. 12B shows a closeup of toolpaths generated with an inward distributed beading scheme for a large wedge shape.

For example, we can choose an w which distributes the discrepancy over the innermost N beads, and distribute most of it to the inner beads, see FIGS. 12A and 12B. In these figures, toolpaths (i.e. beads) having a width closer to the preferred bead width w* have lighter colours than toolpaths that have wider or smaller widths. FIG. 12A shows a closeup of toolpaths generated with an evenly distributed beading scheme for a large wedge shape, and FIG. 12B shows a closeup of toolpaths generated with an inward distributed beading scheme for a large wedge shape. In this way we limit the region of impact of the distributed scheme to a central region and have the preferred bead width w* in regions farther away. This limits the impact of transitioning regions so that transitions keep the toolpaths smooth farther away from the central regions.

Widening meta-scheme. Complementary to any of these schemes we can enforce a minimum feature size and minimum bead width in our framework. Regions where the model is narrower than some $r_{min}$ can be printed with a bead width larger than the model thickness. We can simply override $$q'(d) = \begin{cases} 0 & \text{if } 0 \le d < 2r_{min} \\ 1 & \text{if } 2r_{min} \le d < w^* \\ q(d) & \text{otherwise} \end{cases}$$

$$W'(n, r)_0 = \begin{cases} \max(w_{min} \cdot 2r) & \text{if } 2r < w^* \\ W(n, r)_0 & \text{otherwise} \end{cases}$$

Shell meta-scheme. The industry standard of FDM is to generate only a limited contour-parallel perimeters and to fill the remainder using a direction-parallel strategy. We therefore provide a meta-scheme to generate adaptive bead width toolpaths only in narrow regions and generate the limited number of perimeters M using the preferred width in regions which are wide enough. We also take care not to leave gaps which are too small to be filled using the direction-parallel strategy:

$$q'(d) = \min(M, q(d))$$

$$W'(n, r)_i = \begin{cases} W(n, Mw^*)_i & \text{if } 2r > q^{-1}(M) \\ W(n, r)_i & \text{otherwise} \end{cases}$$

Figure 13A:
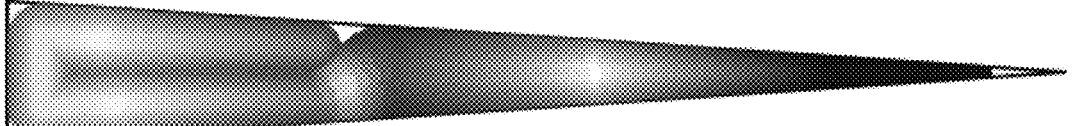
FIG. 13A and FIG. 13B show examples of a filled wedge shape where widening and shell meta-schemes are used.
Figure 13B:
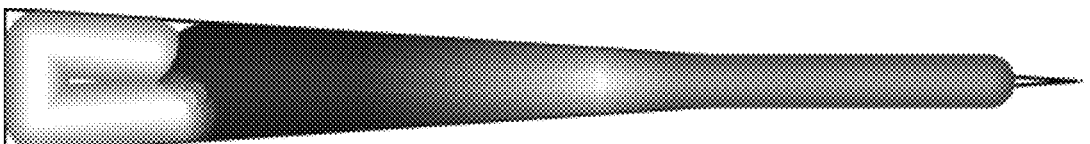
Figure 13C:
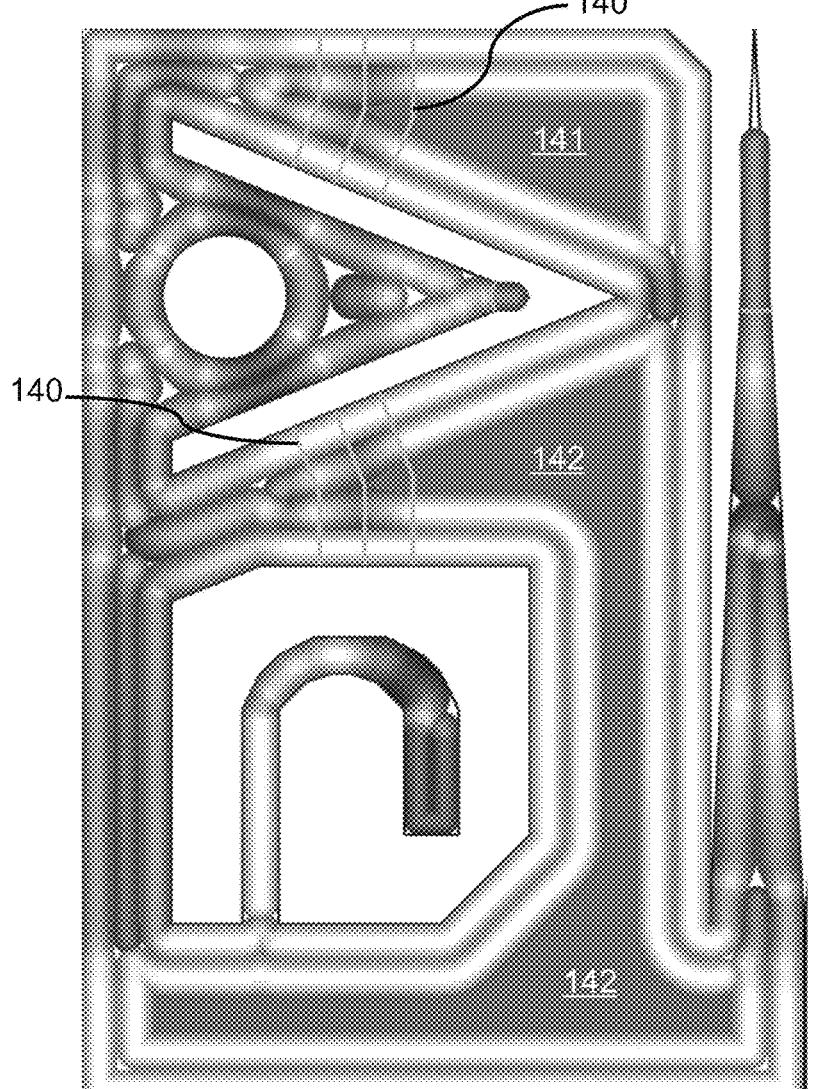
FIG. 13C shows toolpaths generated with the inward distributed strategy (N=1:5) in conjunction with the shell meta-scheme (M=4) and the same widening as in FIG. 13B.

These meta-schemes introduce non-linearities in the quantization function. Because the beading is only evaluated at nodes in the skeleton, we need to make sure that there are nodes at the locations along the skeleton where the non-linearities happen. We therefore insert extra nodes along with their ribs at locations v with a radial distance $R(v)=r_{min}$ for widening and at $R(v) \in \{M w^*, q^{-1}(M), q^{-1}(M)+1/2 w^*\}$ for the transition from narrow shell to unconstrained shell. Combining all meta-schemes functionality we can generate results such as depicted in FIG. 13A-13C. FIG. 13A and FIG. 13B show examples of a filled wedge shape using widening. In FIG. 13A the widening meta-scheme is used with $w_{min}=2r_{min}=0.1$ and in FIG. 13B the widening meta-scheme is used with $w_{min}=0.5$ and $2r_{min}=0.2$.

FIG. 13C shows toolpaths generated with the inward distributed strategy (N=1:5) in conjunction with the shell meta-scheme (M=4) and the same widening as in FIG. 13B. Widening and shell require extra edges, at key locations in the skeleton indicated by lines 140. The area 141 and 142 may then be filled using some direction-parallel toolpaths.

Figure 14:
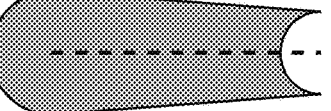
FIG. 14 shows a possible shape covered by an extrusion move.

We first evaluated the accuracy of different beading schemes in terms of the relative amount of the overfill and underfill. We constructed the over- and underfill area by comparing the shapes covered by each extrusion move (see FIG. 14) with each other and with the total shape of the boundary polygons. This resulted in polygonal shapes such as visualized in the top half of FIGS. 15A-15E. FIGS. 15A-15E show simulated printing toolpaths in a polygonal shape using different beading schemes using two different grading schemes. The top of FIGS. 15A-15E highlights the over- and underfill areas, while the bottom of the figures highlights the widths of the beads where darker colours are farther from the preferred width, As can be seen from FIG. 15A, there are light grey shapes 161, 162, 163 where the beads overlap and darker grey shapes 166, 167 in the voids 168, 169 in between the beads.

Figures 16, 17:
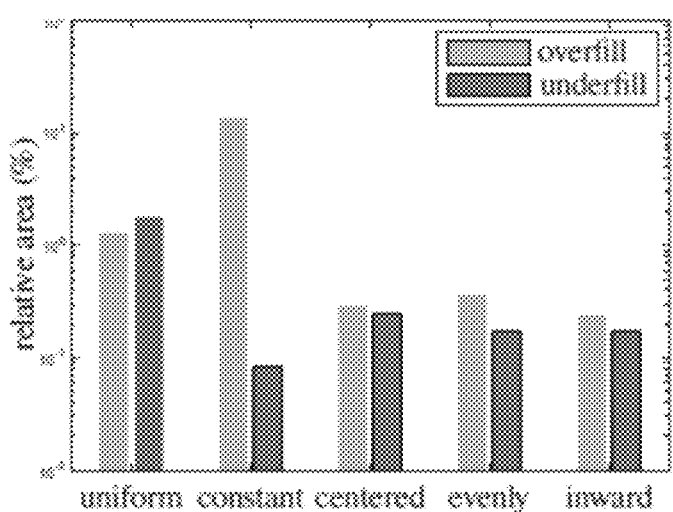
FIG. 16 shows a graph with the relative areas of over- and underfill for the different beading schemes tested, and FIG. 17 schematically shows an example of an FFF device.

We compared the total area in mm² of these overfill and underfill shapes to the total area of the boundary for each sample in the data set and report the average percentages in see FIG. 16. The inward distributed scheme has a calculated overfill of 0.24% and an underfill of 0.17%. This is lower compared to the uniform scheme, which results in 1.2% overfill and 1.7% underfill in the data set.

We visualize the bead widths resulting from the different schemes in the bottom of FIG. 15. We calculated the mean and standard deviation of the bead width, sampled at 1 μm along the toolpaths.

Figures 15A, 15B, 15C, 15D, 15E:
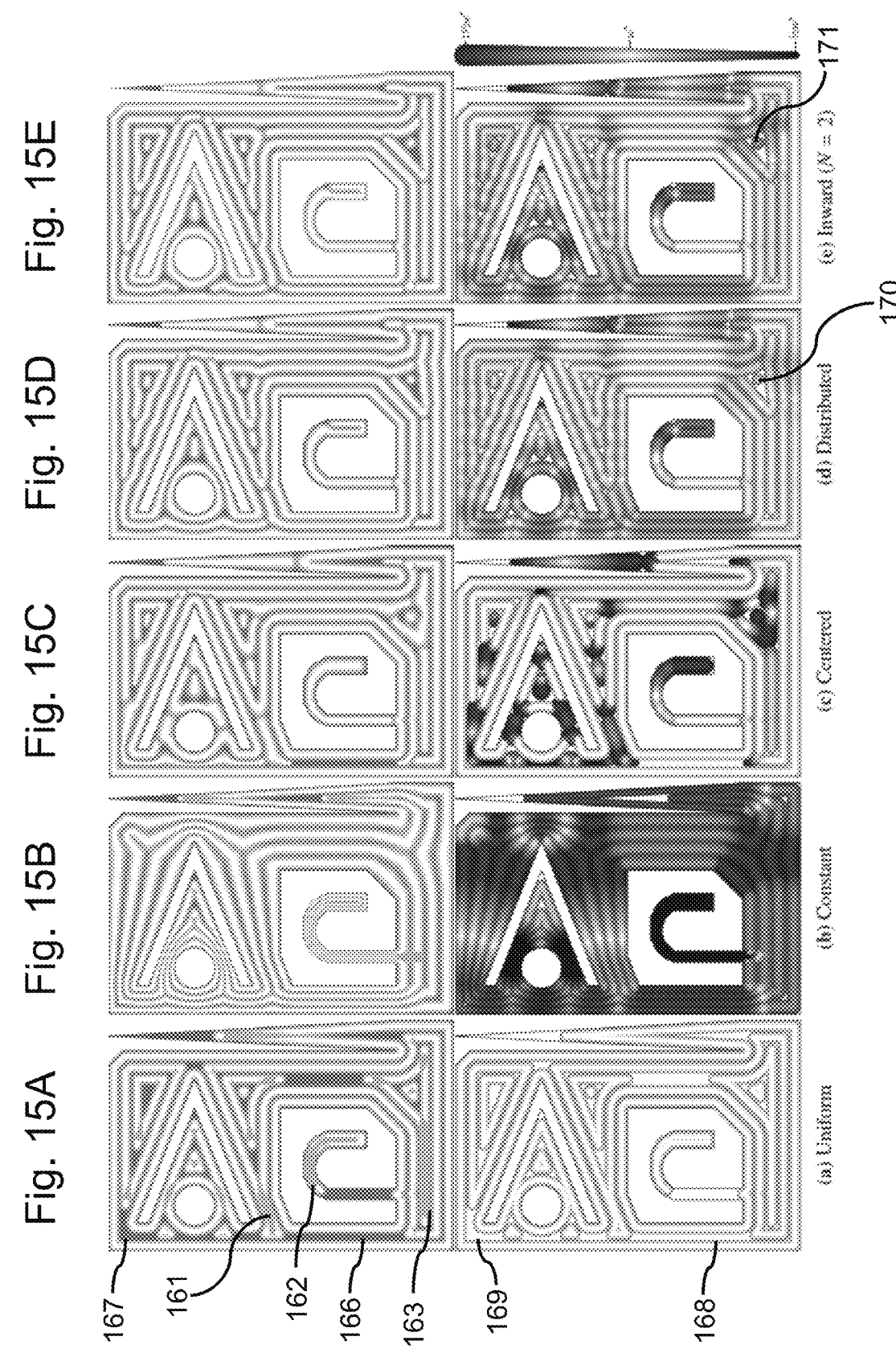
FIG. 15A-15E show simulated printing toolpaths in a polygonal shape using different beading schemes using two different grading schemes.

From FIG. 15A(top) it can be seen that the uniform technique causes a lot of overfills and underfills: on average approximately 1% of the total target area is covered by underfill and likewise for overfill. The constant bead count scheme effectively deals with underfills but generates orders of magnitude more overfills compared to the other schemes. Also, the scheme comes at the cost of greatly varying bead widths and an average bead width that is not close to the preferred bead width. Note that most overfill areas occur near regions of alternating bead width. For an input outline shape which contains both very small and very large features, the constant bead count scheme produces bead widths which can fall outside of the range of manufacturable bead widths. Moreover, the centrality marking is not robust against small perturbations in the outline; adding a small chamfer in a corner causes the unmarked ST to be very small at that location, which results in tiny bead widths.

In FIG. 15C we can see that the centered beading scheme deals with both overfill and underfill and produces desired bead widths in all locations, except for the extrusion paths in the center, where the bead widths range between 0.5w* and 1.8w*, i.e. the variation is within a factor of 3.6. We found that the overfill and underfill for the centered, the evenly distributed and the inward distributed scheme are all approximately 0.2%, which is a considerable improvement over the uniform technique. However, it showed that the centered scheme exhibits a wider range of bead widths than the distributed schemes: the standard deviation of the bead widths in the centered scheme is approximately 39 μm, while that of the distributed schemes is approximately 14 μm. Moreover, because the quantization operator rounds to the nearest number of beads, in the worst case where we switch from a single to two beads the widths switch from 0.75w* to 1.5w*, i.e. the variation is within a factor 2, which is considerably lower the than factor of 3.6 in the centered scheme. We therefore may conclude that the distributed schemes exhibit a lower bead width variation compared to the centered scheme.

FIG. 12A-12B and FIG. 15D-15E show that in the inward distributed scheme the outer toolpaths have the preferred width more often than in the evenly distributed scheme. Furthermore, it was found that compared to evenly distributed, the inward distributed scheme produces smoother toolpaths overall. Thus, the inward distributed scheme prevents over- and underfill, generates smooth toolpaths with more homogeneous width and affects smaller more centered parts of the print than the other schemes.

Toolpath with varying width is particularly meaningful for narrow parts, since there the negative effect of under- and overfill is more pronounced than in wide parts. In extreme cases, thin features will not be filled at all. Therefore, our framework, while working for wide parts as well, shows most of its potential for objects which contain thin parts. For architectural models and casings, preventing over- and underfill is expected to make them stronger. For embossed text, preventing underfill reduces the various holes in the top surfaces, which is detrimental to the visual quality of those top surfaces. For gears and similar mechanical parts that are designed with finite element analysis, the less variation in extrusion widths is closer to the assumptions under fast analysis (e.g. using homogenization [42]).

Of particular interest are microstructures that could be uniquely fabricated by 3D printing. For example, topology optimized bone-like structures [43] contain filaments of varying thickness that follow a varying stress direction. An angled Gyroid structure with uniform thickness also results in outline shapes with varying width. These structures are accurately densely filled using our framework. Another class of microstructures consists of parameterized patterns with varying thickness to achieve functional gradation.

Because the performance of the various toolpathing techniques depends on the geometry of a model, they have ramifications for the practice of design for additive manufacturing. Because the naive method produces under- or overfill for parts of an outline with a constant diameter $d \neq 2iw^*$ it is best practice to design a model such that horizontal cross-sections have a feature diameter of an even integer multiple i of the bead width. For the center scheme and for the current state of the art one should only avoid parts for which $(2i+1.8)w^* < d < (2i+0.5)w^*$ in order to avoid underfill. For the distributed schemes however, there is no diameter at which the framework produces under- or overfill for a part with a constant diameter d. The design consideration therefore reduces to limiting the diameter of your parts to be within the range $[w_{min}, \text{)}$, where $w_{min}$ is a configurable parameter when using the widening meta-scheme.

The default limit bisector angle $\alpha_{max}=135°$ ensures that we don't employ transitioning in shallow wedge regions, which would result in a lot of short odd single bead polylines, which would break up the semi-continuous nature of polygonal extrusion paths; $\alpha_{max}=135°$ corresponds to $w^*/\cos(1/2\alpha_{max})\sim0.4$ mm long segments and under-/overfill areas of $1/4(w^*)^2 (\tan(\alpha/2)-\alpha/2)\sim0.05$ mm$^2$. However, future work might be aimed at reducing under-/overfill in regions with a low bisector angle without the introduction of short single polyline extrusion segments. If the over-/underfill problem is also solved for non-significant regions we might be able to increase $\alpha_{max}$ and reduce the discontinuity introduced by short extrusion segments.

Another limitation of our method is that in a location v with locally maximal $R(v) \approx (i+1/2)w^*$ the odd bead count will result in a single polyline extrusion segment consisting of only a single point. This can be viewed in the bottom right of FIGS. 15D and 15E for example, see dots 170, 171. In order to print such a dot 170, 171, we can make it into a 0.01 mm long extrusion segment, with an altered width such that the total volume remains correct.

Finally it should be noted that although our framework can accurately emulate the constant bead count approach by Ding et. al. [7], its emulation of the centered approach by Jin et. al. [9] is imperfect. The transitions resulting from out framework introduce sharper corners and there is more width variation in those corners. Whereas the width of the connecting segment in the approach by Jin et. al. [9] is the preferred width w*, the bead widths closer to the center resulting from our framework will be twice the local radius, which is larger than w*. However, this inflated bead width variation is expected to have an insignificant impact on the measured bead width variation.

In order to accurately manufacture adaptive width toolpaths using an off-the-shelf 3D printing system, a model is preferred which relates the required width to process parameters such as movement speed and filament extrusion speed. A different approach might be appropriate depending on whether the filament feeder is mounted directly on the print head (a.k.a. direct drive) or the filament fed from the back of the printer to the print head via a Bowden tube. Because Bowden style 3D printing systems have the filament feeder relatively far away from the nozzle, changing the internal pressure in the system requires a large amount of filament movement, which requires a prohibitive amount of time.

Therefore, in an embodiment, we keep the internal pressure constant, and vary the movement speed instead. One approach would be keep the filament inflow f (in mm$^3$/s) constant by varying movement speed accordingly [45]. However, that didn't result in the intended filament outflow variation. We conjecture that the filament outflow is related to the total pressure in the system, which depends not only on the amount of filament in between the feeder wheel and the nozzle (which we kept constant), but also depends on the back pressure that the previous layer exerts on the filament protruding from the nozzle. We conjecture that the amount of back pressure is monotonically related to the requested line width and compensate for the back pressure using a simple linear model:

$$v(w) = f(w)/(hw)$$

$$f(w) = f_0 - k(w/w_o - 1)$$

where v(w) is the movement speed as a function of requested bead width w, f(w) is the filament outflow, h is the layer thickness, $f_0$ is a constant reference flow, k is the amount of back pressure compensation, and $w_0$ is a constant reference bead width.

Our back pressure compensation method effectively changes the speed to realize adaptive width, but this approach is limited, since the movement speed is constrained by acceleration considerations near bends in the toolpath [44]. Moreover, as the layer height is decreased the back pressure becomes larger compared to the internal pressure, which might cause the back pressure compensation method to demand prohibitively slow movement speeds. Furthermore, the shape and filling of the previous layer might influence the amount of back pressure. Accurate flow control can be further enhanced by using a direct drive hardware system and by employing pressure advance algorithms which dynamically change the internal pressure [41]. Conversely, such a setup might benefit from some form of back pressure compensation as well.

The additive manufacturing system mentioned above may be a fused filament fabrication (FFF) device. FIG. 17 schematically shows an example of an FFF device 1000, also referred to as the 3D printer 1000. The 3D printer 1000 comprises a print head 1002 also referred to as a deposition head 1002. At its outer end the print head 1002 comprises a nozzle 1004 where molten filament can leave the deposition head 1002. A filament 1005 is fed into the print head 1002 by means of a feeder 1003. Part of the filament 1005 is stored in a filament storage which could be a spool 1008 rotatably arranged onto a housing (not shown) of the 3D printer, or rotatably arranged within a container (not shown) containing one or more spools.

The 3D printer 1000 comprises a controller 1007 arranged to control the feeder 1003 and the movement of the print head 1002, and thus of the nozzle 1004. The controller 1007 may comprise one or more processing units 1070. In this embodiment, the 3D printer further comprises a Bowden tube 1009 arranged to guide the filament 1005 from the feeder 1003 to the print head 1002. The 3D printer 1000 also comprises a gantry arranged to move the print head 1002 at least in one direction, indicated as the X-direction.

In this embodiment, the print head 1002 is also movable in a Y-direction perpendicular to the X-direction. The gantry comprises at least one mechanical driver 1014 and one or more axles 1015 and a print head docking unit 1016. The print head docking unit 1016 holds the print head 1002 and for that reason is also called the print head mount 1016. It is noted that the print head docking unit 1016 may be arranged to hold more than one print head, such as for example two print heads each receiving its own filament. The feeder 1003 is arranged to feed and retract the filament 1005 to and from the print head 1002. The feeder 1003 may be arranged to feed and retract filament at different speeds to be determined by the controller 1007. A build plate 1018 may be arranged in or under the 3D printer 1000 depending on the type of 3D printer. The build plate 1018 may comprise a glass plate or any other object suitable as a substrate. In the example of FIG. 17, the build plate 1018 is movably arranged relative to the print head 1002 in a Z-direction, see FIG. 17. It is noted that instead of a build plate, other build surfaces may be used such as surfaces of movable belts.

Above several embodiments were described of a method for computing contour-parallel toolpaths employing adaptive bead width in order to minimize underfill and overfill areas, we introduced beading schemes which improve on the state of the art and we have introduced a backpressure compensation method for accurate fabrication of adaptive width. The proposed method is flexible, and can be used with several different beading schemes. The computation times of our method are on par with the state-of-the-art library for performing offsets of non-adaptive bead width. The proposed method is stable, i.e. small local changes in the outline shape cause only small changes in the toolpath.

Compared to the state of the art, the inward distributed beading scheme reduces the amount of beads with a width deviating extremely from the preferred bead width by changing the width of several beads near the center instead of only the center-most bead. It is therefore expected to limit the impact of varying the bead width in terms of production accuracy and homogeneity of material properties, which in turn is helpful to efficiently simulate an FDM manufactured part. The proposed beading scheme greatly improves the process planning for parts with thin contours, which often occur for example in architectural models, prototypes for casings or microstructures. Meanwhile it leaves most of the toolpaths the same as the uniform width technique in large features, meaning that existing studies which relate process parameters with mechanical properties of the print are still applicable. Compared to the naive approach of constant width toolpaths our beading scheme is expected to improve the stiffness, dimensional accuracy and visual qualities of the manufactured model. It is expected that as distributed beading schemes are implemented in commercial software packages and bead width variation control become commonplace, the practice of design for additive manufacturing can disregards some of the nozzle size considerations.

The present invention has been described above with reference to a number of exemplary embodiments as shown in the drawings. Modifications and alternative implementations of some parts or elements are possible, and are included in the scope of protection as defined in the appended claims. The described method uses the skeleton to determine toolpaths based on the local feature size. Other options are possible such as incorporating other information, e.g. properties of the outline such as curvature or visibility, non-local features such as the size of nearby outline features, toolpaths of the previous layer, or voluminal constraints, e.g. for functionally graded materials. It should be noted that the above-mentioned embodiments illustrate rather than limit the invention, and that those skilled in the art will be able to design many alternative embodiments. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The mere fact that certain measures are recited in mutually different dependent claims does not indicate that a combination of these measures cannot be used to advantage.

REFERENCES

[1] S. R. Bates, I. R. Farrow, R. S. Trask, Compressive behaviour of 3D printed thermoplastic polyurethane honeycombs with graded densities, Materials & Design 162 (2018) 130-142, doi:10.1016/j.matdes.2018.11.019.

[2] O. Al-Ketan, R. Rowshan, R. K. Abu Al-Rub, Topology-mechanical property relationship of 3D printed strut, skeletal, and sheet based periodic metallic cellular materials, Additive Manufacturing 19 (2018) 167-183, doi: 10.1016/j.addma.2017.12.006.

[3] I. Maskery, L. Sturm, A. O. Aremu, A. Panesar, C. B. Williams, C. J. Tuck, R. D. Wildman, I. A. Ashcroft, R. J. M. Hague, Insights into the mechanical properties of several triply periodic minimal surface lattice structures made by polymer additive manufacturing, Polymer 152 (2018) 62-71, doi:10. 1016/j.polymer.2017.11.049.

[4] T. Zegard, G. H. Paulino, Bridging topology optimization and additive manufacturing, Structural and Multidisciplinary Optimization 53 (1) (2016) 175-192, ISSN 1615-1488, doi:10.1007/s00158-015-1274-4.

[5] J. Wu, W. Wang, X. Gao, Design and Optimization of Conforming Lattice Structures, IEEE Transactions on Visualization and Computer Graphics (2019) 1-14URL http://arxiv.org/abs/1905.02902.

[6] L. Cheng, J. Bai, A. C. To, Functionally graded lattice structure topology optimization for the design of additive manufactured components with stress constraints, Computer Methods in Applied Mechanics and Engineering 344 (2019) 334-359, doi:10.1016/j.cma.2018.10.010.

[7] D. Ding, Z. Pan, D. Cuiuri, H. Li, N. Larkin, Adaptive path planning for wire-feed additive manufacturing using medial axis transformation, Journal of Cleaner Production 133 (2016) 942-952, doi:10.1016/j.jclepro.2016.06. 036.

[8]Y. Xiong, S.-. Park, S. Padmanathan, A. G. Dharmawan, S. Foong, D. W. Rosen, G. S. Soh, Process planning for adaptive contour parallel toolpath in additive manufacturing with variable bead width, The International Journal of Advanced Manufacturing Technology ISSN 1433-3015, doi: 10.1007/s00170-019-03954-1.

[9]Y. Jin, J. Du, Y. He, Optimization of process planning for reducing material consumption in additive manufacturing, Journal of Manufacturing Systems 44 (2017) 65-78, doi:10.1016/j.jmsy.2017.05.003.

[10] Ultimaker, Ultimaker Cura 4.2.1 software, URL https://ultimaker. com/software/ultimaker-cura, 2019.

[11]M. Livesu, S. Ellero, J. Mart'inez, S. Lefebvre, M. Attene, From 3D models to 3D prints: an overview of the processing pipeline, Computer Graphics Forum 36 (2) (2017) 537-564, doi:10.1111/cgf.13147.

[12]B. N. Turner, R. Strong, S. A. Gold, A review of melt extrusion additive manufacturing processes: I. Process design and modeling, Rapid Prototyping Journal 20 (3) (2014) 192-204, doi:10.1108/RPJ-01-2013-0012.

[13]S. H. Ahn, M. Montero, D. Odell, S. Roundy, P. K. Wright, Anisotropic material properties of fused deposition modeling ABS, Rapid Prototyping Journal 8 (4) (2002) 248-257, doi:10.1108/13552540210441166.

[14]T. Kuipers, J. Wu, C. C. L. Wang, CrossFill: Foam Structures with Graded Density for Continuous Material Extrusion, Computer-Aided Design 114 (2019) 37-50, doi:10.1016/j.cad.2019.05.003.

[15]W. Han, M. A. Jafari, S. C. Danforth, A. Safari, Tool Path-Based Deposition Planning in Fused Deposition Processes, Journal of Manufacturing Science and Engineering 124 (2) (2002) 462-472, doi:10.1115/1.1455026.

[16]J. C. Steuben, A. P. Iliopoulos, J. G. Michopoulos, Implicit slicing for functionally tailored additive manufacturing, CAD Computer Aided Design 77 (2016) 107-119, doi:10.1016/j.cad.2016.04.003.

[17]H. Zhao, B. Chen, F. Gu, Q.-X. Huang, J. Garcia, Y. Chen, C. Tu, B. Benes, H. Zhang, D. Cohen-Or, Connected fermat spirals for layered fabrication, ACM Transactions on Graphics 35 (4) (2016) 1-10, doi:10.1145/2897824. 2925958.

[18]Y. Jin, Y. He, G. Fu, A. Zhang, J. Du, A non-retraction path planning approach for extrusion-based additive manufacturing, Robotics and Computer-Integrated Manufacturing 48 (December 2016) (2017) 132-144, doi: 10.1016/j.rcim.2017.03.008.

[19]M. Held, C. Spielberger, A smooth spiral tool path for high speed machining of 2D pockets, CAD Computer Aided Design 41 (7) (2009) 539-550, doi: 10.1016/j.cad.2009.04.002.

[20]N. Huang, R. Lynn, T. Kurfess, Aggressive Spiral Toolpaths for Pocket Machining Based on Medial Axis Transformation, Journal of Manufacturing Science and Engineering 139 (5) (2017) 051011, doi:10.1115/1.4035720.

[21]S. McMains, J. Smith, J. Wang, C. Sequin, S. Carlo, Layered manufacturing of thin-walled parts, in: ASME Design Engineering Technical Conference, Baltimore, Maryland, Citeseer, 2000.

[22]Y. A. Jin, Y. He, J. Z. Fu, An Adaptive Tool Path Generation for Fused Deposition Modeling, vol. 819, 7-12, doi:10.4028/www.scientific.net/AMR. 819.7, 2013.

[23]D. Ding, Z. Pan, D. Cuiuri, H. Li, A tool-path generation strategy for wire and arc additive manufacturing, International Journal of Advanced Manufacturing Technology 73 (1-4) (2014) 173-183, doi:10.1007/s00170-014-5808-5.

[24]J. J. Cox, Y. Takezaki, H. R. P. Ferguson, K. E. Kohkonen, E. L. Mulkay, Space-filling curves in tool-path applications, Computer-Aided Design 26 (3) (1994) 215-224, doi:https://doi.org/10.1016/0010-4485(94) 90044-2.

[25]J. G. Griffiths, Toolpath based on Hilbert's curve, Computer-Aided Design 26 (11) (1994) 839-844, doi:10.1016/0010-4485(94)90098-1.

[26]S. Shaikh, N. Kumar, P. K. Jain, P. Tandon, Hilbert Curve Based Toolpath for FDM Process, in: C. Mandal, DK and Syan (Ed.), CAD/CAM, ROBOTICS AND FACTORIES OF THE FUTURE, Lecture Notes in Mechanical Engineering, ISBN 2195-4356, 751-759, doi:10.1007/978-81-322-2740-372, 2016.

[27]J.-h. Kao, F. B. Prinz, Optimal motion planning for deposition in layered manufacturing, in: Proceedings of DETC, vol. 98, Citeseer, 13-16, 1998.

[28]Y. Jin, Y. He, J. Du, A novel path planning methodology for extrusion based additive manufacturing of thin-walled parts, International Journal of

[29] Computer Integrated Manufacturing 30 (12) (2017) 1301-1315, doi: 10.1080/0951192X.2017.1307526.

[30] M. Moesen, T. Craeghs, J. P. Kruth, J. Schrooten, Robust beam compensation for laser-based additive manufacturing, CAD Computer Aided Design 43 (8) (2011) 876-888, doi:10.1016/j.cad.2011.03.004.

[31]M. Behandish, A. M. Mirzendehdel, S. Nelaturi, A Classification of Topological Discrepancies in Additive Manufacturing, Computer-Aided Design doi:10.1016/j.cad.2019.05.032.

[32]K. Eiamsa-ard, F. W. Liou, R. G. Landers, H. Choset, Toward Automatic Process Planning of a Multi-Axis Hybrid Laser Aided Manufacturing System: Skeleton-Based Offset Edge Generation, vol. 29th Design Automation Conference of IDETC-CIE, 227-235, doi:10.1115/DETC2003/DAC-48726, 2008.

[33]H. Blum, et al., A transformation for extracting new descriptors of shape, Models for the perception of speech and visual form 19 (5) (1967) 362-380.

[34]D.-T. T. Lee, Medial Axis Transformation of a Planar Shape, IEEE Transactions on Pattern Analysis and Machine Intelligence PAMI-4 (4) (1982) 363-369, doi: 10.1109/TPAMI.1982.4767267.

[35]B. Chazelle, J. Incerpi, Triangulation and shape-complexity, ACM Transactions on Graphics 3 (2) (1984) 135-152, doi:10.1145/357337.357340.

[36]A. Fournier, D. Y. Montuno, Triangulating Simple Polygons and Equivalent Problems, ACM Transactions on Graphics 3 (2) (1984) 153-174, doi:10. 1145/357337.357341.

[37]B. Schaling, The boost C"++ libraries, Boris Schaling, 2011." [37]S. Fortune, A sweepline algorithm for Voronoi diagrams, vol. 2, 153, doi: 10.1007/BF01840357, 1987.

[38]D. Attali, A. Montanvert, Modelling noise for a better simplification of skeletons, in: Proceedings of 3rd IEEE International Conference on Image Processing, vol. 3, IEEE, ISBN 078033258X, 13-16,1996.

[39]A. Sud, M. Foskey, D. Manocha, Homotopy-preserving Medial Axis Simplification (2005) 39-50doi:10.1145/1060244.1060250.

[40]A. Johnson, Clipper—an open source freeware library for clipping and offsetting lines and polygons, Retrieved September.

[41]T. S. Arntsonn, Investigating pressure advance algorithms for filament based melt extrusion additive manufacturing: theory, practice and simulations 25 (5) (2019) 830-839, doi:10.1108/RPJ-10-2018-0275.

[42]X. Liu, V. Shapiro, Homogenization of material properties in additively manufactured structures, Computer-Aided Design 78 (2016) 71-82, ISSN 0010-4485, doi: https://doi.org/10.1016/j.cad.2016.05.017, sPM 2016.

[43]J. Wu, N. Aage, R. Westermann, O. Sigmund, Infill Optimization for Additive ManufacturingApproaching Bone-Like Porous Structures, IEEE Transactions on Visualization and Computer Graphics 24 (2) (2018) 1127-1140, doi:10.1109/TVCG.2017.2655523.

[44]D. S. Ertay, A. Yuen, Y. Altintas, Synchronized material deposition rate control with path velocity on fused filament fabrication machines, Additive Manufacturing 19 (2018) 205-213, doi:10.1016/j.addma.2017.05.011.

[45]T. Kuipers, W. Elkhuizen, J. Verlinden, E. Doubrovski, Hatching for 3D prints: Line-based halftoning for dual extrusion fused deposition modeling, Computers and Graphics (Pergamon) 74, doi:10.1016/j.cag.2018.04.006.

The invention claimed is:

1. A method of determining toolpaths for an infill structure for a digital 3D model, the method comprising:

a. receiving a polygon, the polygon representing an outline of a layer of the digital 3D model;

b. determining a medial axis within the polygon, the medial axis comprising a number of nodes and a number of edges;

c. decomposing areas between the medial axis and the polygon into a set of trapezoids and triangles, by introducing further edges from the nodes of the medial axis to a closest point on the polygon;

d. defining a skeleton comprising the nodes and edges of the medial axis and the further edges;

e. determining, for each node of the skeleton, a feature radius value, where the feature radius of a location on the skeleton is defined as the radius of an inscribed circle centered at the location;

f. calculating, for each edge of the skeleton, a significance value S with $S=|r1-r2|/D$, wherein r1 is the feature radius of a first node of the edge, and r2 is a feature radius of a second node of the edge, and D is a length of the edge;

g. marking those edges of the skeleton that have a significance value S which is lower than a predefined threshold T to obtain the marked edges;

h. defining marked nodes as those nodes which are either connected to a marked edge or have a feature radius larger than all of their neighboring nodes, and defining unmarked nodes as being all those nodes that are not marked nodes;

i. assigning each marked node in the skeleton a bead count value b, which is defined as a number of beads to fit along a diameter of the inscribed circle centered at the respective marked node;

j. assigning to each marked node, a bead distribution B, defined as the combination of a location list L of feature radii values and a bead width list W of bead widths, for which the location list and bead width list have a size of at least half of the bead count b assigned to that marked node;

k. assigning to each unmarked node, a bead distribution B which is based on the bead distributions of nodes connected to the unmarked node via an edge of the skeleton;

l. determining, on each unmarked edge, junctions at those locations along the unmarked edge where the feature radius corresponds to any of the feature radii values in the location list of the node with the higher feature radius value of the two nodes connected to the respective unmarked node and assigning to each of the junctions a corresponding bead width out of the bead width list W;

m. filling the polygon with toolpaths, the toolpaths passing through the junctions and having a variable width defined by the assigned bead widths.

2. The method according to claim 1, wherein before step c), the method comprises:

finding curved lines in the medial axis and dividing the curved lines into a number of straight edges, thereby increasing the number of nodes and edges of the medial axis.

3. The method according to claim 1, wherein the bead count value b of a node is determined by b=round(2r w*), with r being the feature radius of the node and w* being the preferred bead width.

4. The method according to claim 1, wherein the method comprises:

determining on each of the marked edges one or more anchor points using the bead count of the associated nodes;

optionally, removing anchor points which lie within a threshold distance from each other;

determining around each anchor point, a transition starting point and a transition end point lying on the associated marked edge;

adding the transition starting point and transition end point of all the anchor points as further nodes into the skeleton;

adding, for each one of the further nodes of the skeleton an unmarked edge between each of the further nodes of the skeleton and a closest point on the polygon which is closest to the further node.

5. The method according to claim 4, wherein the one or more anchor points are determined at locations on the skeleton which have a feature radius for which the quantization operator q transitions from n to n+1, with n an integer value.

6. A computing device comprising one or more processing units, the one or more processing units being arranged to perform the method according to claim 1.

7. A computer program product comprising code embodied on computer-readable storage and configured so as when run on one or more processing units to perform the method according to claim 1.

* * * * *